United States Patent
Choi et al.

(10) Patent No.: US 11,205,471 B2
(45) Date of Patent: Dec. 21, 2021

(54) MEMORY DEVICE AND OPERATING METHOD THEREOF

(71) Applicant: SAMSUNG ELECTRONICS CO., LTD., Suwon-si (KR)

(72) Inventors: Yonghyuk Choi, Suwon-si (KR); Sangwan Nam, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/935,712

(22) Filed: Jul. 22, 2020

(65) Prior Publication Data

US 2021/0201982 A1    Jul. 1, 2021

(30) Foreign Application Priority Data

Dec. 26, 2019    (KR) .................... 10-2019-0175689

(51) Int. Cl.
*G11C 16/04*    (2006.01)
*G11C 11/408*    (2006.01)
*G11C 5/02*    (2006.01)
*G11C 11/409*    (2006.01)
*G11C 5/06*    (2006.01)
*G11C 11/4074*    (2006.01)

(52) U.S. Cl.
CPC .......... *G11C 11/4087* (2013.01); *G11C 5/025* (2013.01); *G11C 5/063* (2013.01); *G11C 11/409* (2013.01); *G11C 11/4074* (2013.01); *G11C 11/4085* (2013.01)

(58) Field of Classification Search
CPC ..... G11C 11/4087; G11C 5/025; G11C 5/063; G11C 11/4074; G11C 11/4085; G11C 11/409
USPC .................................................... 365/185.17
See application file for complete search history.

(56) References Cited

U.S. PATENT DOCUMENTS

| | | | |
|---|---|---|---|
| 6,804,150 B2 * | 10/2004 | Park .................. | G11C 16/12 365/185.02 |
| 7,468,918 B2 | 12/2008 | Dong et al. | |
| 7,830,724 B2 | 11/2010 | Park et al. | |
| 8,953,376 B2 * | 2/2015 | Nam ................ | H01L 27/11556 365/185.11 |
| 9,424,926 B2 | 8/2016 | Lee et al. | |
| 9,564,234 B2 | 2/2017 | Kwak et al. | |
| 10,121,542 B2 | 11/2018 | Nam et al. | |
| 10,157,674 B2 | 12/2018 | Kim et al. | |
| 2015/0009760 A1 | 1/2015 | Nam et al. | |
| 2015/0221373 A1 | 8/2015 | Nam | |

(Continued)

*Primary Examiner* — Huan Hoang
(74) *Attorney, Agent, or Firm* — Lee IP Law, PC

(57) ABSTRACT

A memory device includes a memory cell array including cell strings, respectively connected between string select lines and ground select lines, and wordlines connected to memory cells, a control logic to generate a first voltage provided to the string select lines, and a second voltage provided to the ground select lines, and to adjust voltage levels of the first and second voltages to control a channel boosting level of the cell strings, and a row decoder to provide a read voltage, a read pass voltage, and the first and second voltages to the memory cell array under control of the control logic. The control logic generates one of the first and second voltage as a pre-pulse voltage. The row decoder provides a third voltage to at least one of the wordlines.

19 Claims, 27 Drawing Sheets

(56) References Cited

U.S. PATENT DOCUMENTS

2016/0012898 A1    1/2016  Shim et al.
2018/0137925 A1*   5/2018  Nam ..................... G11C 16/10

* cited by examiner

| WORDLINE | SSL1 (SELECTED) | SSL2 (UNSELECTED) | SSL3 (UNSELECTED) | SSL4 (UNSELECTED) | CHANNEL POTENTIAL | |
|---|---|---|---|---|---|---|
| | on | off | off | off | $P1 \rightarrow P2$ | |
| WL12 | $V_{READ}$ | | | | 0V | SECONDARY BOOSTING |
| WL11 | $V_{PASS}$ | | | | | |
| WL10 | $V_{PASS}$ | | | | | |
| WL9 | $V_{CON2}$ | | | | | |
| WL8 | $V_{CON1}$ | | | | | |
| WL7 (B_WLs) | $0 \rightarrow V_{PASS}$ | | | | CH1 | |
| WL6 (B_WLs) | $0 \rightarrow V_{PASS}$ | | | | | |
| WL5 | $V_{CON1}$ | | | | PRIMARY BOOSTING | |
| WL4 | $V_{CON2}$ | | | | | |
| WL3 | $V_{PASS}$ | | | | | |
| WL2 | $V_{PASS}$ | | | | | |
| WL1 | $V_{PASS}$ | | | | | |
| | GSL1 (SELECTED) | GSL2 (UNSELECTED) | GSL3 (UNSELECTED) | GSL4 (UNSELECTED) | CH2 | CH |
| | on | off | off | off | | |

FIG. 13A

| WORDLINE | SSL1 (UNSELECTED) | SSL2 (SELECTED) | SSL3 (UNSELECTED) | SSL4 (UNSELECTED) | CHANNEL POTENTIAL | |
|---|---|---|---|---|---|---|
| | off | on | off | off | P1 | → P2 |
| WL12 | $V_{READ}$ | | | | PRIMARY BOOSTING | SECONDARY BOOSTING |
| WL11 | $V_{PASS}$ | | | | | |
| WL10 | $V_{PASS}$ | | | | | |
| WL9 | $V_{PASS}$ | | | | | |
| WL8 | $V_{PASS}$ | | | | | |
| WL7 | $V_{CON2}$ | | | | | |
| WL6 | $V_{CON1}$ | | | | | |
| WL5 | $0 \rightarrow V_{READ}$ | | | | CH1 | |
| WL4 | $0 \rightarrow V_{READ}$ | | | | | |
| WL3 | $V_{CON1}$ | | | | OV | CH |
| WL2 | $V_{CON2}$ | | | | | |
| WL1 | $V_{PASS}$ | | | | | |
| | GSL1 (UNSELECTED) | GSL2 (SELECTED) | GSL3 (UNSELECTED) | GSL4 (UNSELECTED) | CH2 | |
| | off | on | off | off | | |

(B_WLs indicates WL5, WL4)

FIG. 15A

| WORDLINE | SSL1 (SELECTED) | SSL2 (UNSELECTED) | SSL3 (UNSELECTED) | SSL4 (UNSELECTED) | CHANNEL POTENTIAL | |
|---|---|---|---|---|---|---|
| | on | off | off | off | P1 → | P2 |
| WL12 | $V_{READ}$ | | | | PRIMARY BOOSTING | SECONDARY BOOSTING |
| WL11 | $V_{PASS}$ | | | | | |
| WL10 | $V_{PASS}$ | | | | | |
| WL9 | $V_{CON1}$ | | | | | |
| WL8 (B_WL1) | $0 \to V_{PASS}$ | | | | CH1 | |
| WL7 | $V_{CON1}$ | | | | PRIMARY BOOSTING | |
| WL6 | $V_{PASS}$ | | | | | |
| WL5 | $V_{CON1}$ | | | | | |
| WL4 (B_WL2) | $0 \to V_{PASS}$ | | | | CH2 | |
| WL3 | $V_{CON1}$ | | | | OV | |
| WL2 | $V_{PASS}$ | | | | | |
| WL1 | $V_{PASS}$ | | | | | |
| | GSL1 (SELECTED) | GSL2 (UNSELECTED) | GSL3 (UNSELECTED) | GSL4 (UNSELECTED) | CH3 | CH |
| | on | off | off | off | | |

FIG. 17A

MEMORY DEVICE AND OPERATING METHOD THEREOF

CROSS-REFERENCE TO RELATED APPLICATION

Korean Patent Application No. 10-2019-0175689, filed on Dec. 26, 2019, in the Korean Intellectual Property Office, and entitled: "Memory Device and Operating Method Thereof," is incorporated by reference herein in its entirety.

BACKGROUND

1. Field

Embodiments relate to a memory device and an operating method thereof.

2. Description of the Related Art

A memory device, including a nonvolatile memory element, uses a pre-pulse scheme to prevent hot carrier injection (HCI) or soft erase from occurring when performing a read operation, a program verify operation, or the like.

SUMMARY

Embodiments are directed to a memory device, including a memory cell array including a plurality of cell strings each including a plurality of memory cells, respectively connected between a plurality of string select lines and a plurality of ground select lines, and a plurality of wordlines connected to the plurality of memory cells, a control logic configured to generate a first voltage that is provided to the plurality of string select lines, and a second voltage that is provided to the plurality of ground select lines, and to adjust each voltage level of the first voltage and the second voltage to control a channel boosting level of the plurality of cell strings, and a row decoder configured to provide a read voltage, a read pass voltage, the first voltage, and the second voltage to the memory cell array under control of the control logic. The control logic may generate one of the first voltage and the second voltage as a pre-pulse voltage. The row decoder may provide a third voltage to at least one of the plurality of wordlines. The third voltage may have a first level while the pre-pulse voltage has a level higher than or equal to a predetermined first threshold value and having a second level, higher than the first level, while the pre-pulse voltage has a level lower than the first threshold value.

Embodiments are also directed to a memory device, including a plurality of cell strings, each including a plurality of memory cells disposed at intersections of a plurality of wordlines and a plurality of bitlines, and connected between a plurality of string select lines and a plurality of ground select lines in series, and a control logic configured to select at least one of the plurality of cell strings to perform a read operation or a program verify operation and to control a pre-pulse voltage such that the pre-pulse voltage is selectively input to a string select line or a ground select line connected to an unselected cell string. The pre-pulse voltage may have a value that is greater than a predetermined threshold value during a period before a predetermined read voltage according to a threshold voltage distribution is input to a selected cell string, and may have a value that is less than or equal to the predetermined threshold value during a period in which the predetermined read voltage is input.

Embodiments are also directed to a memory device, including a memory cell array including a plurality of cell strings, each including a plurality of memory cells, and a plurality of wordlines connected to the plurality of memory cells, a control logic configured such that a plurality of string select lines or a plurality of ground select lines, connected to the plurality of cell strings, are controlled to be pre-charged, and at least one of the plurality of wordlines is adjusted to control a potential level of each channel of the plurality of cell strings, to perform a read operation and a program verify operation, and a row decoder configured to input a read voltage or a read pass voltage to the plurality of wordlines to control the read operation or the program verify operation under control of the control logic. The control logic may select at least one wordline, among wordlines connected to dummy memory cells among the plurality of memory cells, as a barrier line, and may input a predetermined control voltage having a level that is lower than a level of the read pass voltage to control a potential level of the channel.

BRIEF DESCRIPTION OF DRAWINGS

Features will become apparent to those of skill in the art by describing in detail example embodiments with reference to the attached drawings in which:

FIGS. 13A and 13B illustrate an operation of a memory device according to an example embodiment.

FIGS. 14 to 15B illustrate an operation of a memory device according to an example embodiment.

FIGS. 16 to 17B illustrate an operation of a memory device according to an example embodiment.

DETAILED DESCRIPTION

Figure 1:
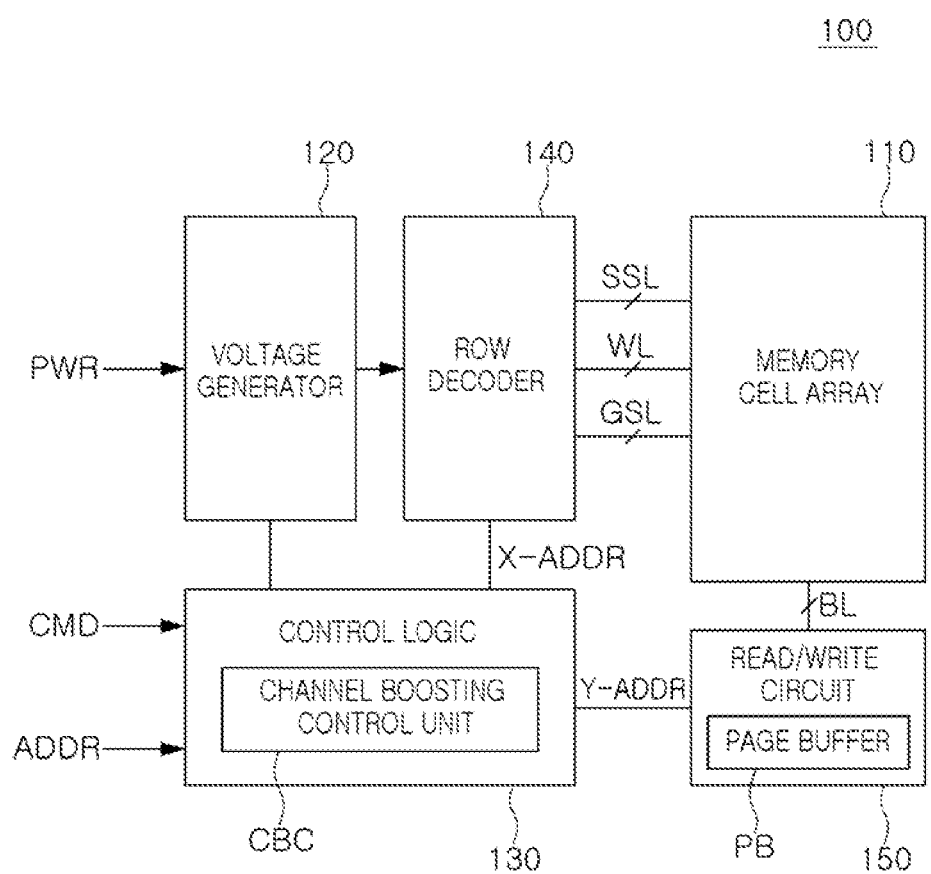
FIG. 1 illustrates a memory device according to an example embodiment.

FIG. 1 illustrates a memory device according to an example embodiment.

Referring to FIG. 1, a memory device 100 according to an example embodiment may include a memory cell array 110, a voltage generator 120, a control logic 130, a row decoder 140, and a read/write circuit 150. The memory cell array 110 may include a plurality of memory cells and may be separated into a plurality of blocks.

The plurality of memory cells may be connected to the row decoder 140 through string select lines SSL, wordlines WL, and ground select lines GSL, and may be connected to a page buffer PB of the read/write circuit 150 through bitlines BL. As an example, in each of the plurality of blocks included in the memory cell array 110, a plurality of memory cells arranged at the same height from a substrate may be connected to the same wordline WL, and a plurality of memory cells arranged in the same location on a plane parallel to an upper surface of the substrate may provide a cell string sharing a single channel region.

The voltage generator 120 may generate various voltages used for an operation of the memory device 100 using externally supplied power PWR. For example, the voltage generator 120 may generate a read voltage and a read pass voltage provided to wordlines WL for a read operation and/or a program verification operation. In addition, the voltage generator 120 may generate a control voltage and a pre-pulse voltage provided to string select lines SSL and ground select lines GSL.

The control logic 130 may generate various control signals for a programming operation or a read operation based on a command CMD and an address ADDR externally received. For example, the control logic 130 may generate a voltage control signal for controlling levels of voltages generated by the voltage generator 120. In addition, the control logic 130 may provide a row address signal X-ADDR to the row decoder 140 and may provide a column address signal Y-ADDR to the read/write circuit 150.

The row decoder 140 may select at least one cell string among a plurality of cell strings, included in the memory cell array 110, in response to the row address signal X-ADDR and may select at least one wordline among a plurality of wordlines connected to the selected cell string. As an example, in a read operation, the row decoder 140 may provide a read voltage to a selected wordline and may provide a read pass voltage to an unselected wordline. In addition, the row decoder 140 may provide a control voltage used for a read operation to a selected string select line and a selected ground select line connected to the selected cell string.

In an example embodiment, the row decoder 140 may selectively provide a pre-pulse voltage to an unselected string select line or an unselected ground select line connected to an unselected cell string in a read operation. For example, the row decoder 140 may provide a pre-pulse voltage to the unselected string select line and a ground voltage to the unselected ground select line during a setup period of a wordline. In another implementation, the row decoder 140 may provide a ground voltage to the unselected string select line and a pre-pulse voltage to the unselected ground select line during the setup period of the wordline.

The control logic 130 may be configured to control a channel boosting level of a cell string to a predetermined level in a read operation, and may include a channel boosting control unit CBC. The channel boosting control unit CBC may output a pre-pulse control signal to the row decoder 140 to selectively provide the pre-pulse voltage to the unselected string selection line or the unselected ground selection line during a predetermined channel boosting period in a read operation. In addition, the channel boosting control unit CBC may logically divide a channel region, included in the unselected cell string, into a plurality of channel regions during the predetermined channel boosting period in the read operation, and may select at least one of a plurality of unselected wordlines as a barrier line to control each channel boosting level of the plurality of separated channel regions. In FIG. 1, the channel boosting control unit CBC is illustrated as being included in the control logic 130. However, the channel boosting control unit CBC may be implemented outside of the control logic 130.

The channel boosting control unit CBC may control the row decoder 140 to provide a voltage lower than a predetermined threshold value, for example, to provide a ground voltage, to a barrier line during a channel boosting period in which potential of the plurality of logically separated channel regions is adjusted. In addition, the channel boosting control unit CBC may control the row decoder 140 to provide a voltage higher than or equal to the threshold, for example, to provide the same voltage as a read pass voltage, to the barrier line during a sensing period in which a read voltage is input to a selected wordline and a page buffer reads data from a selected memory cell connected to the selected wordline.

During the channel boosting period, under the control of the channel boosting control unit CBC, potential of the channel disposed above the barrier line may be boosted to a first level, and a potential of the channel disposed below the barrier line may be boosted to a second level. The second level may be lower than the first level, and may be, for example, a ground level. The above example may correspond to a case in which the selected wordline is disposed above the barrier line. As an example, when the selected wordline is disposed below the barrier line, the potential of the channel disposed above the barrier line may be boosted to the second level, and the potential of the channel disposed below the barrier line may be boosted to the first level.

When a voltage higher than or equal to a predetermined threshold is input to the barrier line during a sensing period, the potentials of the channels disposed above and below the barrier line may be boosted to a third level that is lower than the first level and higher than the second level. Accordingly, the channel potential of the unselected cell string may be lower than an existing boosting level when the read operation is performed by the channel boosting control unit CBC. As a result, an increase in power consumption may be significantly reduced and occurrence of hot-carrier injection (HCI) or soft erase may be effectively suppressed.

The read/write circuit 150 may operate as a write driver or a sense amplifier, and may include a page buffer PB. For example, in a programming operation, the read/write circuit 150 may operate as a write driver to provide a voltage, which is determined depending on data to be stored in the memory cell array 110, to a bitlines BL. Also, during a read operation, the read/write circuit 150 may operate as a sense amplifier to sense data stored in the memory cell array 110.

The memory device 100 according to an example embodiment may have a multi-stack (or multilayer) structure in which each of the channel regions penetrating through a plurality of wordlines WL includes a lower channel region and an upper channel region. The lower channel region and the upper channel region may be connected to each other in a direction perpendicular to a substrate. The number of stacked stages of the plurality of wordlines WL may be variously determined to be 48, 64, 96, or the like, depending on the degree of integration density of the memory device 100. In an example embodiment, the number of the stacked stages of the plurality of wordlines WL may be about 190 or more.

The memory device 100 according to an example embodiment may have a cell-on-peri (COP) structure in which a plurality of memory cells are formed and disposed on a peripheral circuit. The peripheral circuit may include the control logic 130, the row decoder 140, and the read/write circuit 150, on a single wafer. In another implementation, the memory device 100 may have a structure in which peripheral circuits and a plurality of memory cells are formed on different wafers and are then electrically connected to each other using a metal interconnect technology, or the like.

Figure 2:
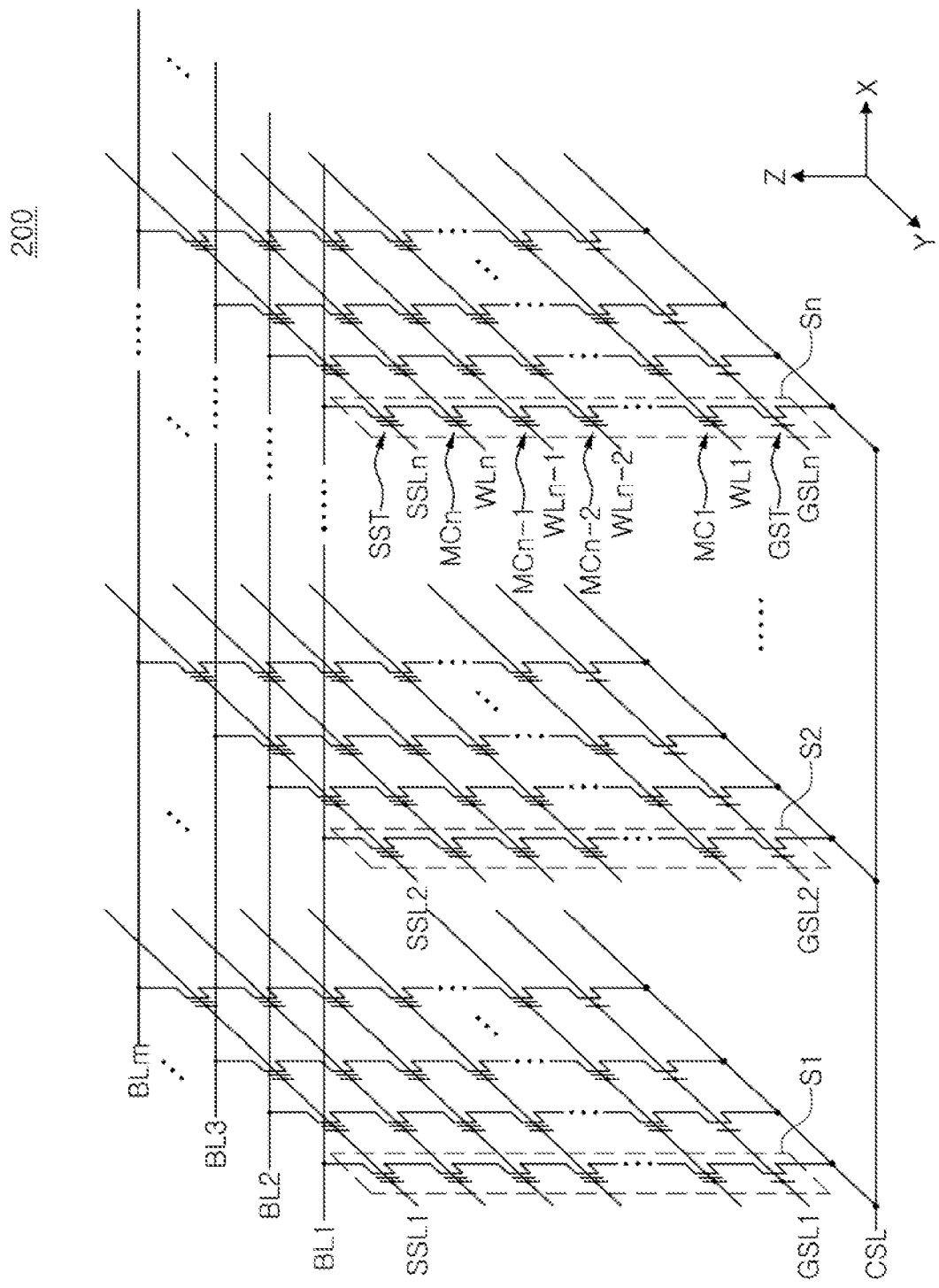
FIG. 2 is an equivalent circuit diagram illustrating a memory cell array of a memory device according to an example embodiment.

FIG. 2 is an equivalent circuit diagram illustrating a memory cell array of a memory device according to an example embodiment.

Referring to FIG. 2, a memory cell array 200 may include a plurality of cell strings S1 to Sn, each including n memory cells MC1 to MCn connected to each other in series. The cell strings S1 to Sn may each include a ground select transistor GST and a string select transistor SST, respectively connected to both ends of the memory cells MC1 to MCn in series. The n memory cells MC1 to MCn, connected to each other in series, may be connected to n wordlines WL1 to WLn, respectively. Dummy cells, in which data is not stored, may be further provided between the ground select transistor GST and the first memory cell MC1 and/or between the string selection transistor SST and the n-th memory cell MCn. The dummy cells may be variously added to locations other than the above-mentioned locations.

In the ground select transistor GST, a gate terminal may be connected to the ground select lines GSL1 to GSLn, and a source terminal may be connected to a common source line CSL. In the string select transistor SST, a gate terminal may be connected to string select lines SSL1 to SSLn, and a source terminal may be connected to a drain terminal of the n-th memory cell MCn.

Although FIG. 2 illustrates a structure in which a single ground select transistor GST and a single string select transistor SST are connected to the n memory cells MC1 to MCn connected to each other in series, a plurality of ground select transistors GST and/or a plurality of string select transistors SST may be connected to the n memory cells MC1 to MCn.

A drain terminal of the string select transistor SST may be connected to a respective one of the bitlines BL1 to BLm. When a signal is input to a gate terminal of the string select transistor SST through the string select line SSL1 to SSLn, a signal input through the bitlines BL1 to BLm may be transmitted to the memory cells MC1 to MCn, connected to each other in series, to perform a programming operation or a read operation. In addition, a predetermined erase voltage may be input through a well region, formed in the substrate, such that an erase operation is performed to erase data written into the memory cells MC1 to MCn.

In a read operation, a turn-on voltage having a predetermined level may be input to a selected string selection line and a selected ground select line connected to a selected cell string. In addition, a predetermined pre-pulse voltage may be selectively input to an unselected string select line or an unselected ground select line connected to an unselected cell string. Based on at least one selected from a plurality of unselected wordlines, a channel disposed on one side of the barrier line may have potential set to a first level, and a channel disposed on the other side of the barrier line may have potential set to a second level different from the first level. The potential of the channel may be set to a third level between the first level and the second level during a sensing period in which a read voltage is input to a selected wordline connected to a selected memory cell to read data.

Figure 3A:
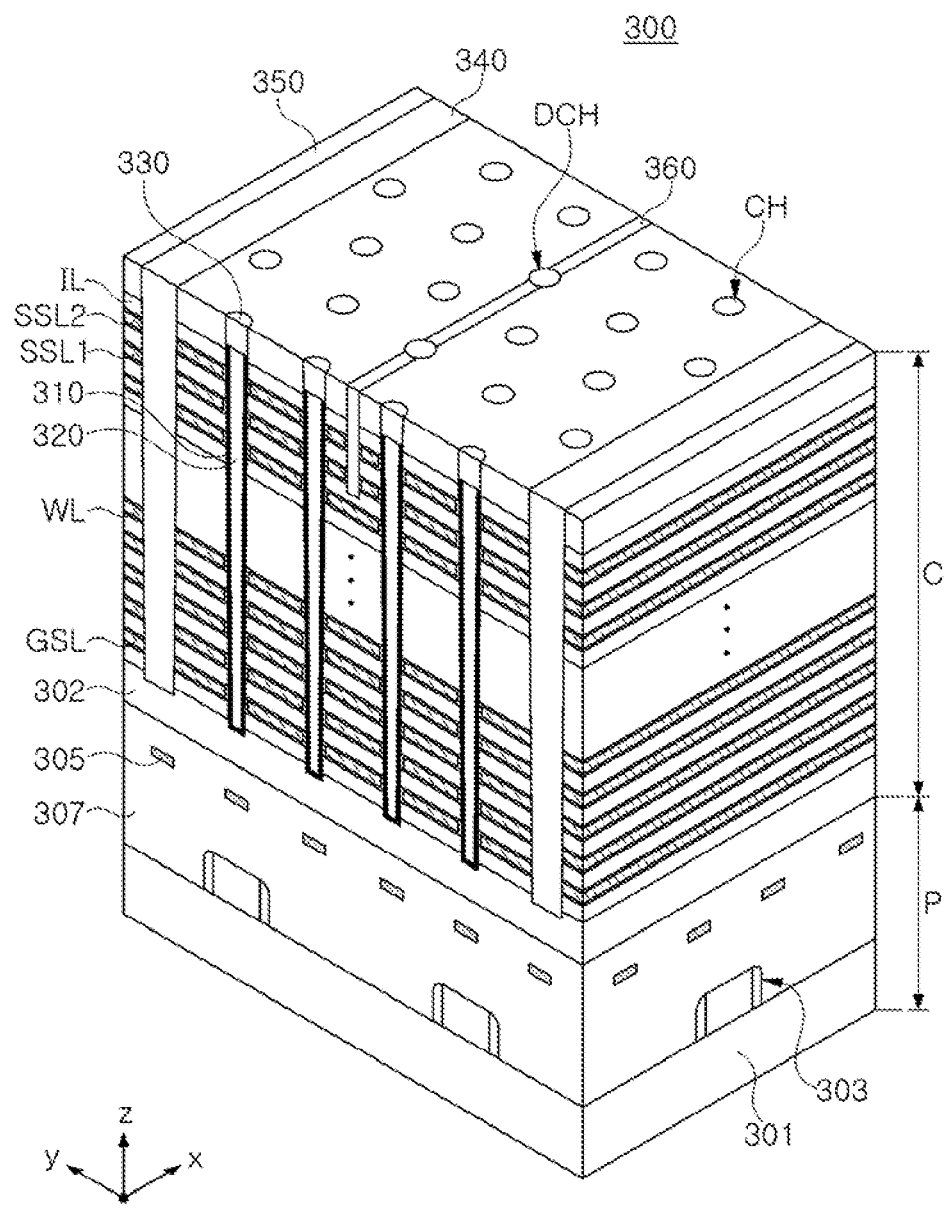
FIGS. 3A and 3B illustrate a memory device according to an example embodiment.
Figure 3B:
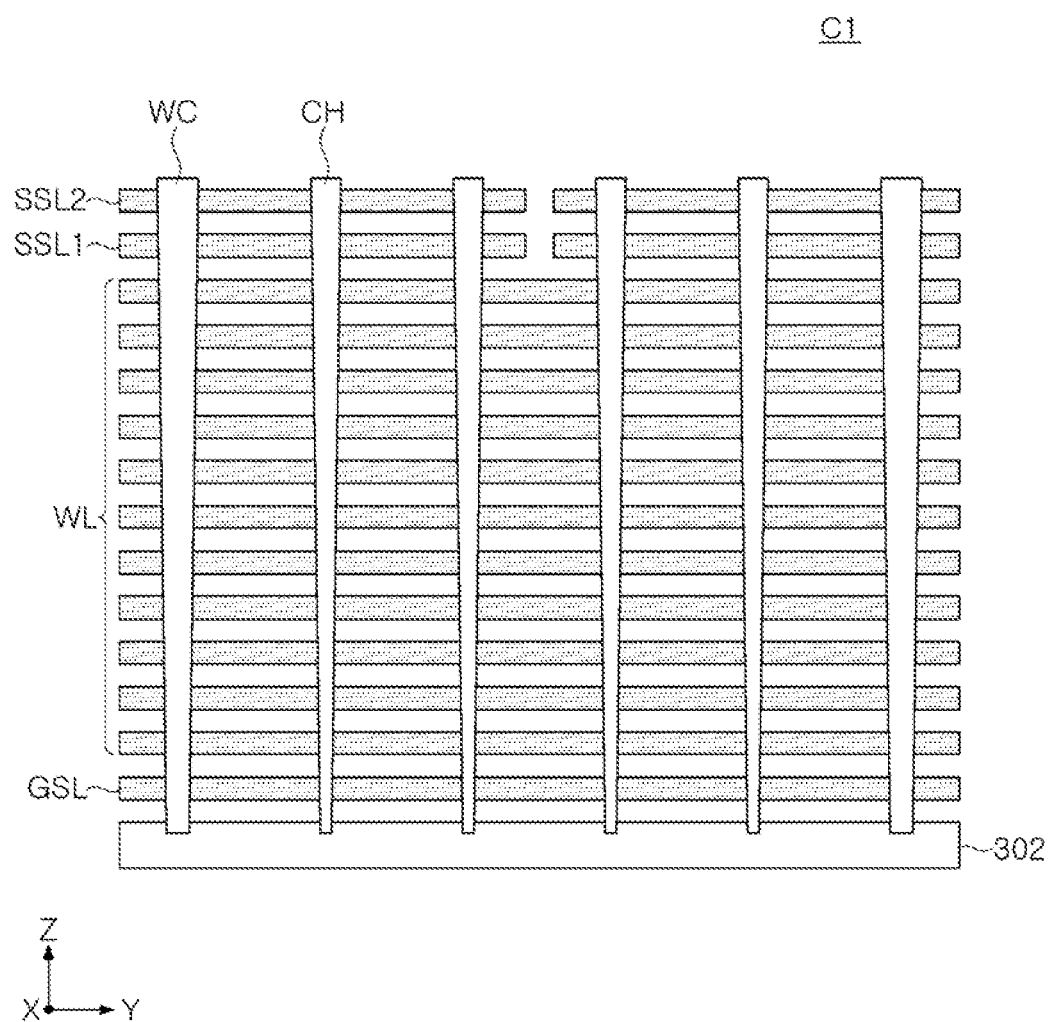

FIGS. 3A and 3B illustrate a memory device according to an example embodiment. FIG. 3A illustrates a structure of the memory device according to an example embodiment, and FIG. 3B illustrates a structure of a cell region of the memory device according to an example embodiment.

Referring first to FIG. 3A, a memory device 300 according to an example embodiment may include a cell region C and a peripheral circuit region P, stacked in a vertical direction.

The peripheral circuit region P may be disposed below the cell region C, and may include a first substrate 301. In addition, the peripheral circuit region P may include a plurality of circuit elements 303 provided on the first substrate 301, a plurality of wiring lines 305 connected to the circuit elements 303, an interlayer insulating layer 307 insulating the circuit elements 303 and the wiring lines 305 from each other, and the like. The circuit elements 303, included in the peripheral circuit region P, may provide circuits (e.g., a page buffer, a row decoder, and the like) used to drive the memory device 300.

The cell region C may include a second substrate 302 disposed on the first interlayer insulating layer 307. In addition, the cell region C may include a ground select line GSL, wordlines WL, and string select lines SSL1 and SSL2, and a plurality of insulating layers IL stacked on the second substrate 302. The plurality of insulating layers IL may be alternately stacked with the ground select line GSL, the wordlines WL, and the string select lines SSL1 and SSL2. The number of the ground select lines GSL and the string select lines SSL1 and SSL2 may be variously modified relative to that illustrated in FIG. 3A.

In addition, the cell region C may include channel structures CH extending in a first direction (a Z-axis direction) perpendicular to an upper surface of the second substrate 302. The channel structures CH may penetrate through the ground select line GSL, the wordlines WL, and the string select lines SSL1 and SSL2 to connect to the second substrate 302. The channel structures CH may include a channel region 310, a buried insulating layer 320 filling an internal space of the channel region 310, a bitline connection layer 330, and the like. Each of the channel structures CH may be connected to at least one bitline through the bitline connection layer 330. The ground select line GSL, the wordlines WL, the string select lines SSL1 and SSL2, the insulating layers IL, and the channel structures CH may be defined as a stacked structure.

At least one gate insulating layer may be disposed outside of the channel region 310. In an example embodiment, the gate insulating layer may include a tunneling layer, a charge storage layer, a blocking layer, and the like, sequentially disposed from the channel region 310. At least one of the tunneling layer, the charge storage layer, and the blocking layer may have a shape surrounding the ground select line GSL, the wordlines WL, and the string select lines SSL1 and SSL2.

The ground select line GSL, the wordlines WL, and the string select lines SSL1 and SSL2 may be covered with the interlayer insulating layer 350. Also, the ground select line GSL, the wordlines WL, and the string select lines SSL1 and SSL2 may be separated into a plurality of regions by wordline cuts 340. In an example embodiment, the string select lines SSL1 and SSL2 may be separated into a plurality of regions by a separation insulating layer 360 between a pair of wordline cuts 340 adjacent to each other in a second direction (a Y-axis direction) parallel to an upper surface of the second substrate 302.

In a region in which the separation insulating layer 360 is disposed, one or more dummy channel structures DCH having the same structure as the channel structures CH may be provided. Unlike the channel structures CH, the dummy channel structures DCH may not be electrically connected to bitlines.

Referring to FIG. 3B, a cell region C1 of the memory device 300 according to an example embodiment may include a ground select line GSL, wordlines WL, and string select lines SSL1 and SSL2 stacked on an upper surface of the substrate 302. The ground select line GSL, the wordlines WL, and the string select lines SSL1 and SSL2 may be separated into a plurality of regions by wordline cuts WC, and the string select lines SSL1 and SSL2 may be separated into a plurality of regions between the pair of wordline cuts WC. The number of the ground select lines GSL and the string select lines SSL1 and SSL2 may be different from that illustrated in FIG. 3B. The channel structures CH may penetrate through the ground select line GSL, the wordlines WL, and the string select lines SSL1 and SSL2.

The channel structures CH and the wordline cuts WC may extend in a first direction (a Z-axis direction), and widths thereof may not be constant along the first direction. For example, the channel structures CH and the wordline cuts WC may have a tapered structure in which a width decreases, e.g., a width in a Y-axis direction, along the first direction toward the substrate 302.

Different from what is illustrated in FIGS. 3A and 3B, in a memory device according to another example embodiment, each of the channel structures CH may have a double-layer stacked structure including an upper channel structure and a lower channel structure, as described below in detail with reference to FIGS. 4A and 4B.

Figure 4A:
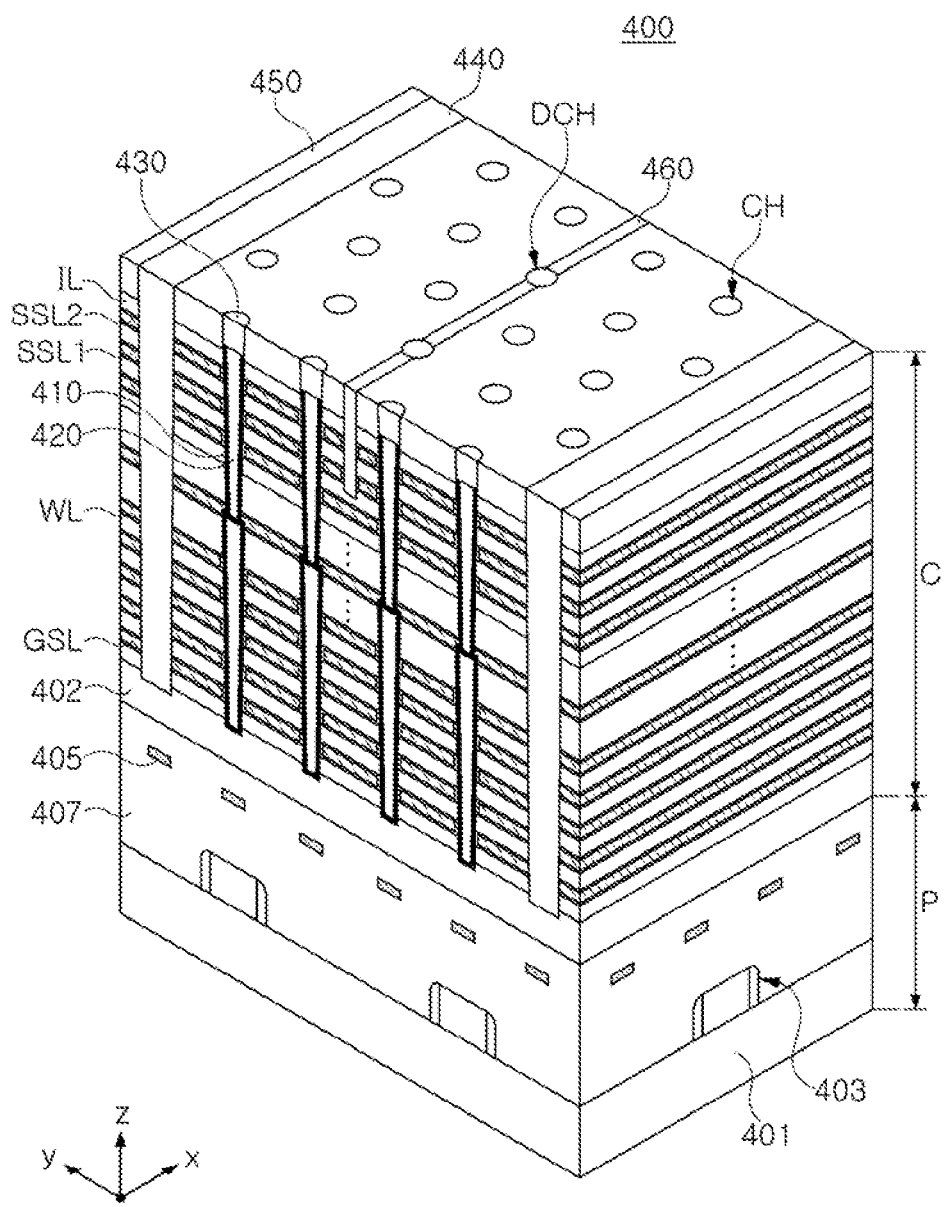
FIGS. 4A and 4B illustrate a memory device according to an example embodiment.
Figure 4B:
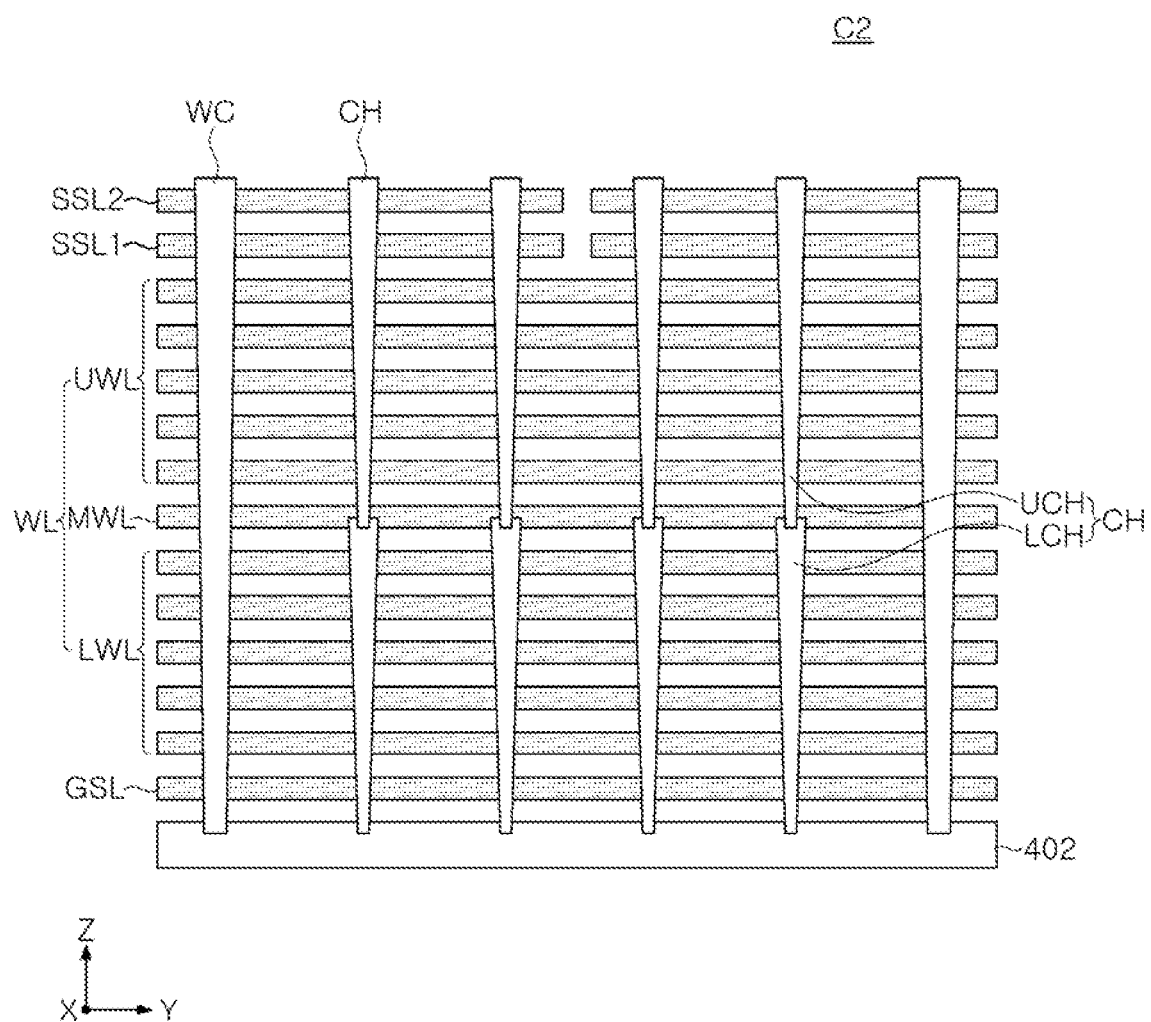

FIGS. 4A and 4B illustrate a memory device according to an example embodiment. FIG. 4A illustrates a structure of the memory device according to an example embodiment, and FIG. 4B illustrates a structure of a cell region of the memory device according to an example embodiment.

Referring to FIG. 4A, a memory device 400 according to an example embodiment may include a cell region C and a peripheral circuit region P stacked in a vertical direction. The memory device 400 of FIG. 4A may have a structure similar to that of the memory device 300 of FIG. 3A, and duplicate descriptions may be omitted below.

The memory device 400 may include channel structures CH extending in a first direction (a Z-axis direction), perpendicular to an upper surface of the second substrate 402, through a ground select line GSL, wordlines WL, and string select lines SSL1 and SSL2. To overcome a process difficulty caused by an increase in the number of wordlines WL, after lower wordlines are stacked and a lower channel structure is formed, upper wordlines may be stacked and an upper channel structure may be formed. As a result, as illustrated in FIG. 4A, each of the channel structures CH may have a double-layer stacked structure including the upper channel structure and the lower channel structure.

The lower channel structure may extend from a second substrate 402, and the upper channel structure may extend from the lower channel structure to be connected to the bitline through the bitline connecting layer 430. In each of the channel structures CH, the channel region 410 of the upper channel structure and the channel region 410 of the lower channel structure may be connected to each other. The upper channel structure, the lower channel structure, and the wordline cuts 440 may have a tapered structure having a width decreased in a direction toward the second substrate 402 from the first direction (the Z-axis direction).

Referring to FIG. 4B, in a cell region C2 of the memory device 400 according to an example embodiment, each of the channel structures CH may include a lower channel structure LCH that extends from the substrate 402, and an upper channel structure UCH that is connected to the lower channel structure LCH. The lower channel structure LCH may penetrate through lower wordlines LWL and may provide lower memory cells. The upper channel structure UCH may penetrate through upper wordlines UWL and may provide upper memory cells. In addition, a middle wordline MWL may be disposed at a boundary between the upper channel structure UCH and the lower channel structure LCH connected to each other. In the example embodiment illustrated in FIG. 4B, it is assumed that the number of the lower wordlines LWL and the number of the upper wordlines UWL are the same, but the number of the lower wordlines LWL and the number of the upper wordlines UWL may be different from each other and may be variously changed.

In the example embodiment illustrated in FIG. 4B, wordline cuts WC may be formed at one time. As a result, each of the wordline cuts WC may have a height greater than a height of the lower channel structure LCH or the upper channel structure UCH. The channel structures CH and the wordline cuts WC may have different side profiles to each other.

In the memory devices 300 and 400 according to example embodiments described with reference to FIGS. 3A to 4B, at least one of a plurality of wordlines WL may be selected as a barrier line while a read operation is performed, and a voltage input to the barrier line may be controlled to be different from the other unselected wordlines. Thus, channel potential of an unselected cell string may be controlled. For example, in the memory devices 300 and 400, among unselected wordlines, at least one unselected wordline may be selected as a barrier line in a read operation and/or a program verify operation, and a point in time at which a read pass voltage is input to the barrier line may be controlled to follow a channel boosting period. Thus, the channel potential of the unselected cell string may be controlled within a predetermined range. As described above, the channel potential of the unselected cell string may be controlled within a predetermined range during a read operation, so that occurrence of hot-carrier injection (HCI) or soft erase may be suppressed to improve data reliability. As an example, in the example embodiment illustrated in FIGS. 4A and 4B, the middle wordline MWL adjacent to a boundary between the lower channel structure LCH and the upper channel structure UCH may be selected as the barrier line.

Figure 5:
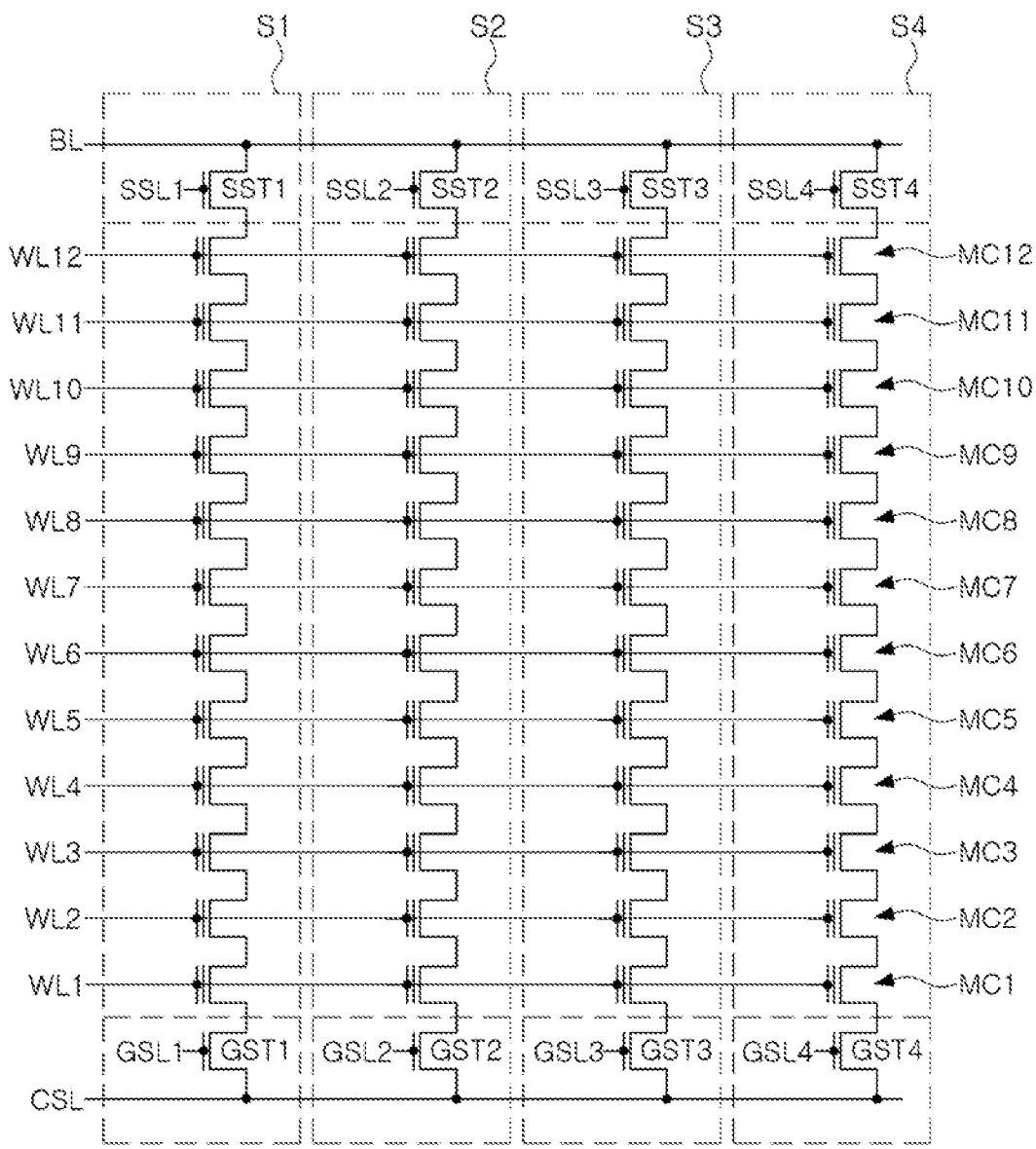
FIG. 5 is a circuit diagram illustrating cell strings of a memory device according to an example embodiment.

FIG. 5 is a circuit diagram illustrating cell strings of a memory device according to an example embodiment.

Referring to FIG. 5, a memory device according to an example embodiment may include a plurality of cell strings S1 to S4 included in a memory cell array 500. In FIG. 5, the memory cell array 500 is illustrated as including four cell strings S1 to S4. However, the number of the cell strings S1 to S4 may be variously changed.

The plurality of cell strings S1 to S4 may be connected to a bitline BL through respective string select transistors SST1 to SST4. For example, a first cell string S1 may be connected to the bitline BL through a first string select transistor SST1. Similarly, a fourth cell string S4 may be connected to the bitline BL through a fourth string select transistor SST4. Different from what is illustrated in FIG. 5, at least one the plurality of cell strings S1 to S4 may be connected to different bitlines BL. The plurality of string select transistors SST1 to SST4 may receive a control signal from a row decoder through the different string select lines SSL1 to SSL4.

The cell strings S1 to S4 may be connected to a common source line CSL through respective ground select transistors GST1 to GST4. For example, the first cell string S1 may be connected to the common source line CSL through a first ground select transistor GST1. Similarly, a fourth cell string S4 may be connected to the common source line CSL through a fourth ground select transistor GST4. The plurality of ground select transistors GST1 to GST4 may receive a control signal from a row decoder through different ground select lines GSL1 to GSL4 to operate.

Each of the cell strings S1 to S4 may include a plurality of memory cells MC1 to MC12 connected to each other in series between the respective string select transistor SST1 to SST4 and the respective ground select transistor GST1 to GST4. In FIG. 5, each of the four cell strings S1 to S4 is illustrated as including 12 memory cells MC1 to MC12. However, the number of the memory cells may be variously changed. Each cell string S1 to S4 may further include at least one dummy memory cell disposed between the ground select transistor GST1 to GST4 and the first memory cell MC1 and/or between the twelfth memory cell MC12 and the string select transistor SST1 to SST4. In another example embodiment, the dummy memory cell may be added to a location different from the above-mentioned example location.

A plurality of memory cells arranged along the same row may be connected to the same wordline. For example, the first memory cells MC1 included in the plurality of cell strings S1 to S4 may be commonly connected to the first wordline WL1. Similarly, the twelfth memory cells MC12 included in the plurality of cell strings S1 to S4 may be commonly connected to the twelfth wordline WL12.

In the memory device, one of the plurality of cell strings S1 to S4 may be selected during a read operation and/or a program verify operation, and a read voltage and a read pass voltage may be input to the plurality of wordlines WL1 to WL12 that are connected to the selected cell string. For example, the read voltage may be input to a selected wordline that is connected to a selected memory cell to read data, and a read pass voltage may be input to an unselected wordline. Also, in the memory device, a predetermined turn-on voltage may be input to a selected string select line and a selection ground select line that is connected to a selected cell string. In an example embodiment, the read pass voltage may about 10 V or lower, and the turn-on voltage may be about 5 V to about 8 V.

Figure 6:
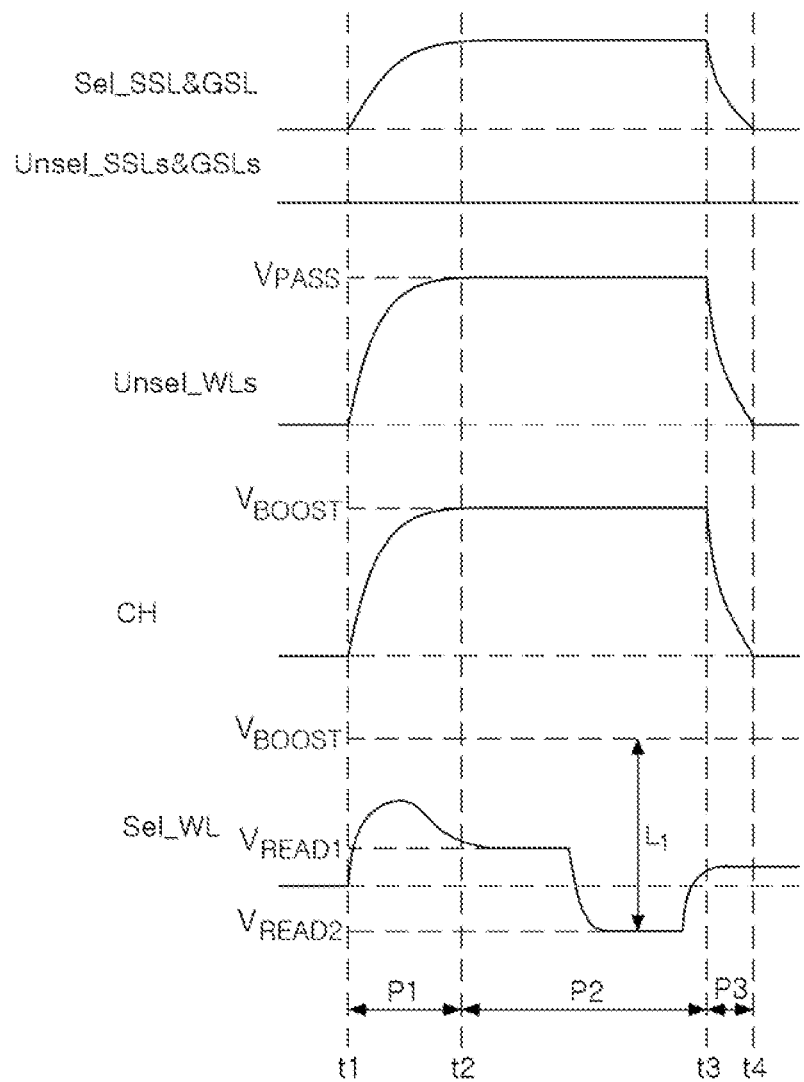
FIGS. 6 to 8 illustrate operations of a memory device according to an example embodiment.
Figure 7:
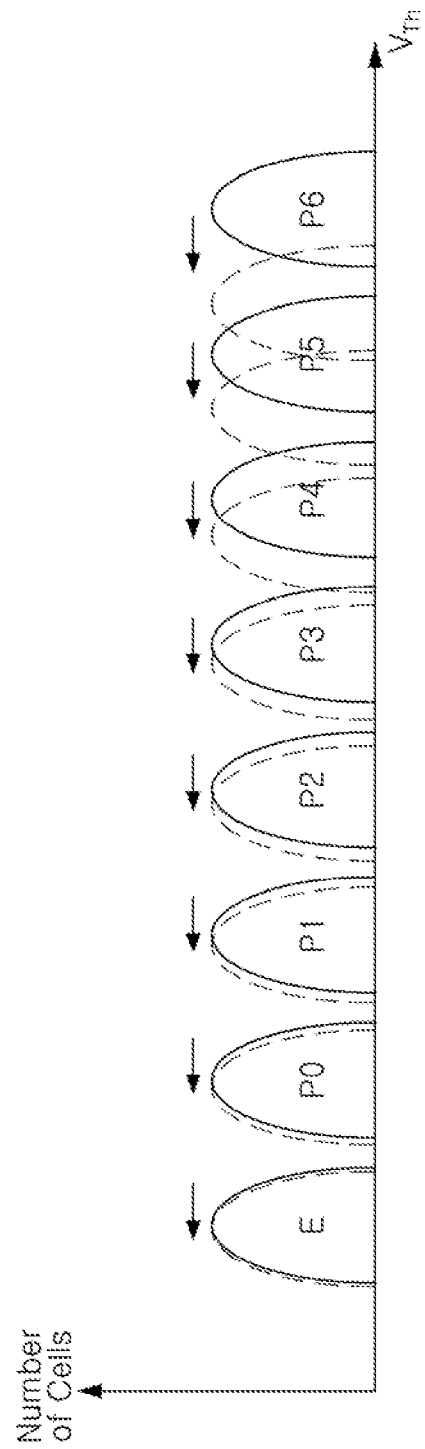
Figure 8:
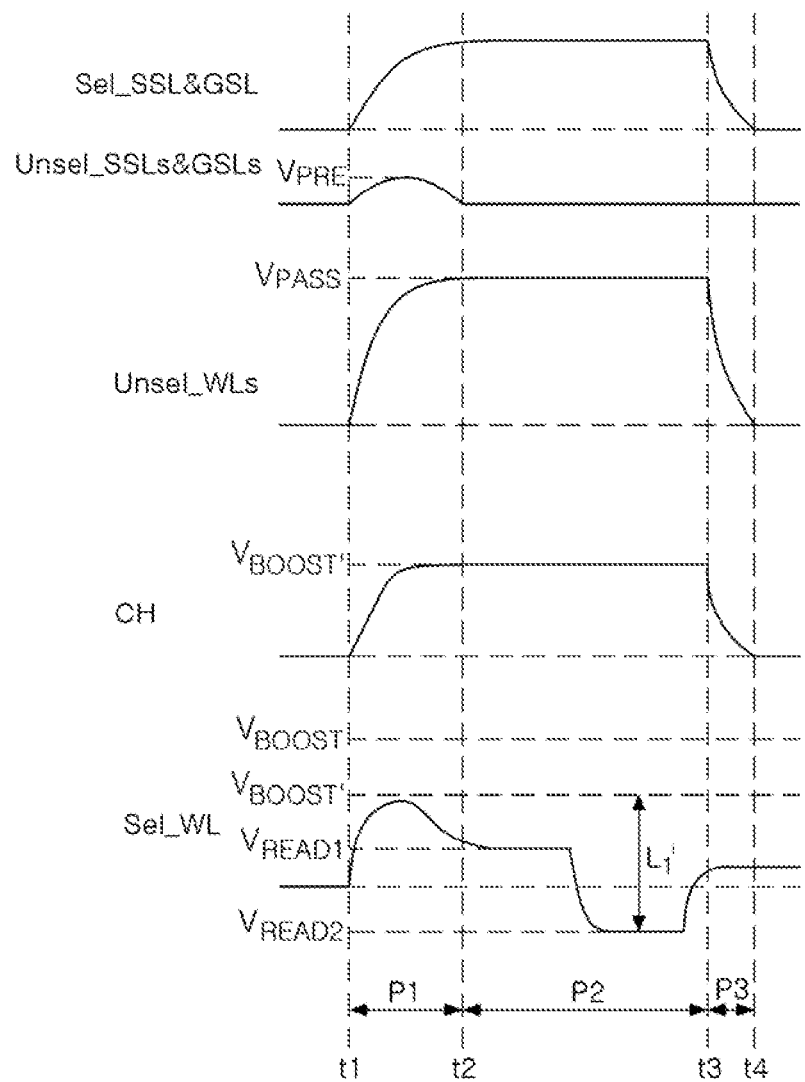

FIGS. 6 to 8 illustrate operations of a memory device according to an example embodiment. FIGS. 6 and 8 are waveform diagrams illustrating operations of the memory device, and FIG. 7 illustrates a change in a threshold voltage distribution of the memory device.

Referring to FIG. 6, a read operation and/or a program verify operation of the memory device may include a first period P1, a second period P2, and a third period P3. The first period P1 may be a period between t1 and t2, in which a channel of an unselected cell string is boosted. The second period P2 may be a period between t2 and t3, in which predetermined read voltages VREAD1 and VREAD2 are input to a selected wordline according to a threshold voltage distribution of a selected memory cell. The third period P3 may be a period between t3 and t4, in which a recovery operation is performed.

During the first period P1 and the second period P2, a selected string select transistor and a selected ground select transistor that are included in a selected cell string may be supplied with a voltage, which is higher than or equal to a threshold voltage, through a selected string select line and a selected ground select line Sel_SSL & GSL to be turned on. During the first period P1 and the second period P2, unselected string select transistors and unselected ground select transistors that are included in unselected cell strings may be supplied with a voltage, which is lower than or equal to the threshold voltage, through unselected string select lines and unselected ground select lines Unsel_SSLs & GSLs to be turned off.

In the memory device, a read pass voltage VPASS may be input to unselected wordlines Unsel_WLs during the first period P1 and the second period P2. In the memory device, a pre-charge voltage may be input to selected wordline Sel_WL during the first period P1 and read voltages VREAD1 and VREAD2 may be input to the selected wordline Sel_WL during the second period P2. The read voltage, and the number and level of memory cells may vary relative to what is illustrated in FIG. 6, for example, depending on a threshold voltage distribution of the memory cells. For example, when the memory cell is a triple-level cell (TLC) storing 3 bits of data, the memory device may perform a read operation using two or more read voltages having different levels to each other.

The above operation may cause a channel potential CH of the unselected cell string to be boosted to a predetermined level VBOOST during the first period P1, and soft erase may occur due to a voltage difference L1 between the read voltages VREAD1 and VREAD2.

When the soft erase occurs, a threshold voltage distribution of a memory cell may transition, as illustrated in FIG. 7. The higher a threshold voltage of the memory cell is, the more the degree of transition of the threshold voltage distribution may be increased. The transition of the threshold voltage distribution may have various aspects, unlike what is illustrated in FIG. 7. For example, the threshold voltage may be decreased in third to sixth program states P3 to P6, and may be increased in an erased state to a second program state E to P2.

Accordingly, at least portions of the threshold voltage distribution of the memory cell may overlap each other. As a result, the read voltage may not be precisely determined, and thus, a reading failure may occur and reliability of the memory device may be deteriorated.

To address the above-described issues, in the memory device, a pre-pulse voltage may be input to both the unselected string select line and the unselected ground select line Unsel_SSLs & GSLs during the first period P1 to reduce the degree of boosting the channel potential CH of the unselected cell string. Referring to FIG. 8, during the first period P1, unselected string select transistors and unselected ground select transistors connected to an unselected cell string may be supplied with a voltage VPRE, higher than or equal to a threshold voltage, through unselected string select lines and unselected ground select lines Unsel_SSLs & GSLs to be turned on.

In the memory device, a read pass voltage VPASS may be input to an unselected wordlines Unsel_WLs during the first period P1 and the second period P2. In the memory device, a pre-charge voltage may be input to a selected wordline Sel_WL during the first period P1, and read voltages VREAD1 and VREAD2 may be input to selected wordline Sel_WL during the second period P2.

The above operation may cause potential of the channel CH of the unselected cell string to be boosted to a predetermined boosting level VBOOST' during the first period P1. In this case, since a voltage difference L1' between the boosting level VBOOST' of the channel CH of the unselected cell string and the read voltages VREAD1 and VREAD2 may be reduced as compared with the voltage difference L1 illustrated in the example embodiment described with reference to FIG. 6, occurrence of soft erase may be significantly reduced.

In the operation described with reference to FIG. 8, both the unselected string select transistor and the unselected ground select transistor are turned on during the first period P1, and thus, power consumption and a size of a power supply may be increased. Therefore, in the memory device according to the present example embodiments, only a portion of a channel of the unselected cell string may be boosted during the first period P1 to reduce ultimate potential of the channel of the unselected cell string, and soft erase may be prevented from occurring. Furthermore, in the memory device according to the present example embodiment, a pre-pulse voltage may be selectively input to an unselected string select line or an unselected ground select line to significantly reduce an increase in the power consumption and the size of the power supply.

Figure 9:
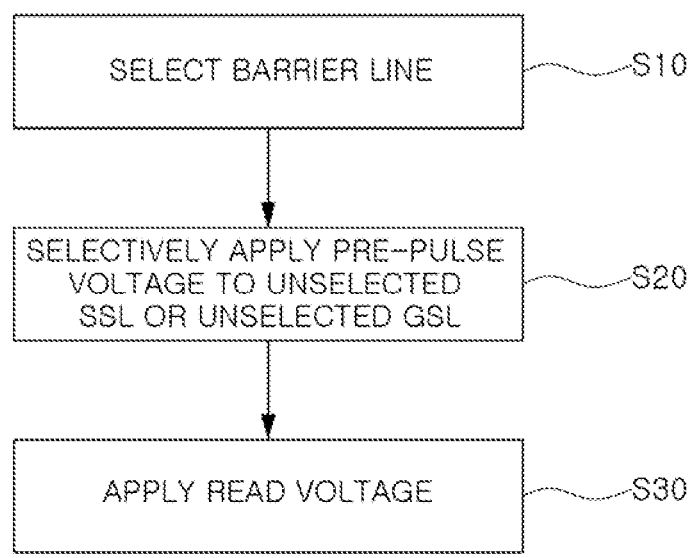
FIG. 9 is a flowchart illustrating an operating method of a memory device according to an example embodiment.

FIG. 9 is a flowchart illustrating an operating method of a memory device according to an example embodiment.

Referring to FIG. 9, a read operation and/or a program verify operation of a memory device according to an example embodiment may start with selecting at least one of a plurality of wordlines, connected to a selected cell string, as a barrier line (S10). In the memory device, at least one wordline, among wordlines other than a selected wordline, may be selected as a barrier line. As an example, at least one of dummy wordlines may be selected as a barrier line.

In an example embodiment, the read operation and/or the program verify operation of the memory device may include a first period in which channel potential of an unselected cell string is boosted, a second period in which a read voltage is input to a selected wordline connected to a selected memory cell, a third period in which a recovery operation is performed, and the like. In the memory device, a voltage lower than a predetermined threshold value, for example, a ground voltage may be input to the barrier line during the first period, and a voltage higher than or equal to the predetermined threshold value, for example, a read pass voltage, may be input to the barrier line during the second period.

In the memory device, a pre-pulse voltage may be input to an unselected string select line or an unselected ground select line that is included in the unselected cell string during the first period (S20). For example, during the first period, the pre-pulse voltage may be input to the unselected string select line and a turn-off voltage, for example, a ground voltage, may be input to the unselected ground select line. In another implementation, during the first period, a turn-off voltage may be input to the unselected string select line and a pre-pulse voltage may be input to the unselected ground select line. Accordingly, during the first period, the channel of the unselected cell string may be separated into a region in which channel potential is boosted to a first level on one side of the barrier line, and a region in which the channel potential is boosted to a second level, different from the first level, on the other side of the barrier line. When a read pass voltage is input to the barrier line during the second period, potential of the channel of the unselected cell string may be boosted to a third level between the first level and the second level.

In the memory device, a predetermined read voltage may be input to a selected wordline to perform a read operation (S30). In an example embodiment, since the potential of the channel of the unselected cell string has the third level between the first level and the second level, a change in the threshold voltage distribution of the memory cell, resulting from occurrence of soft erase, may be reduced, a reading failure or the like may be prevented, and reliability of the memory device may be improved. In addition, since the pre-pulse voltage may be selectively input to the unselected string select line or the unselected ground select line, power consumption and a size of a power supply may be decreased as compared with a pre-pulse scheme according to the related art.

Hereinafter, a method of selecting a barrier line in a memory device according to an example embodiment will be described in further detail.

Figure 10A:
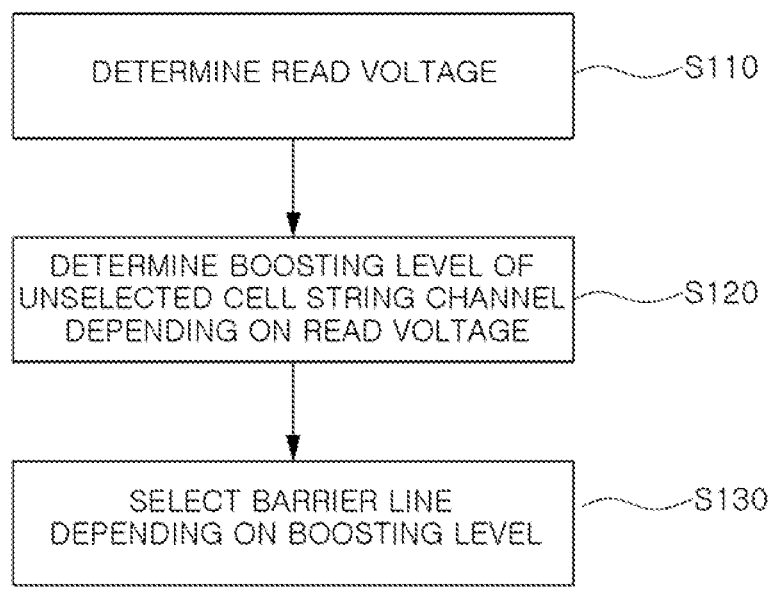
FIGS. 10A and 10B are flowcharts illustrating a method of selecting a barrier line in a memory device according to an example embodiment.
Figure 10B:
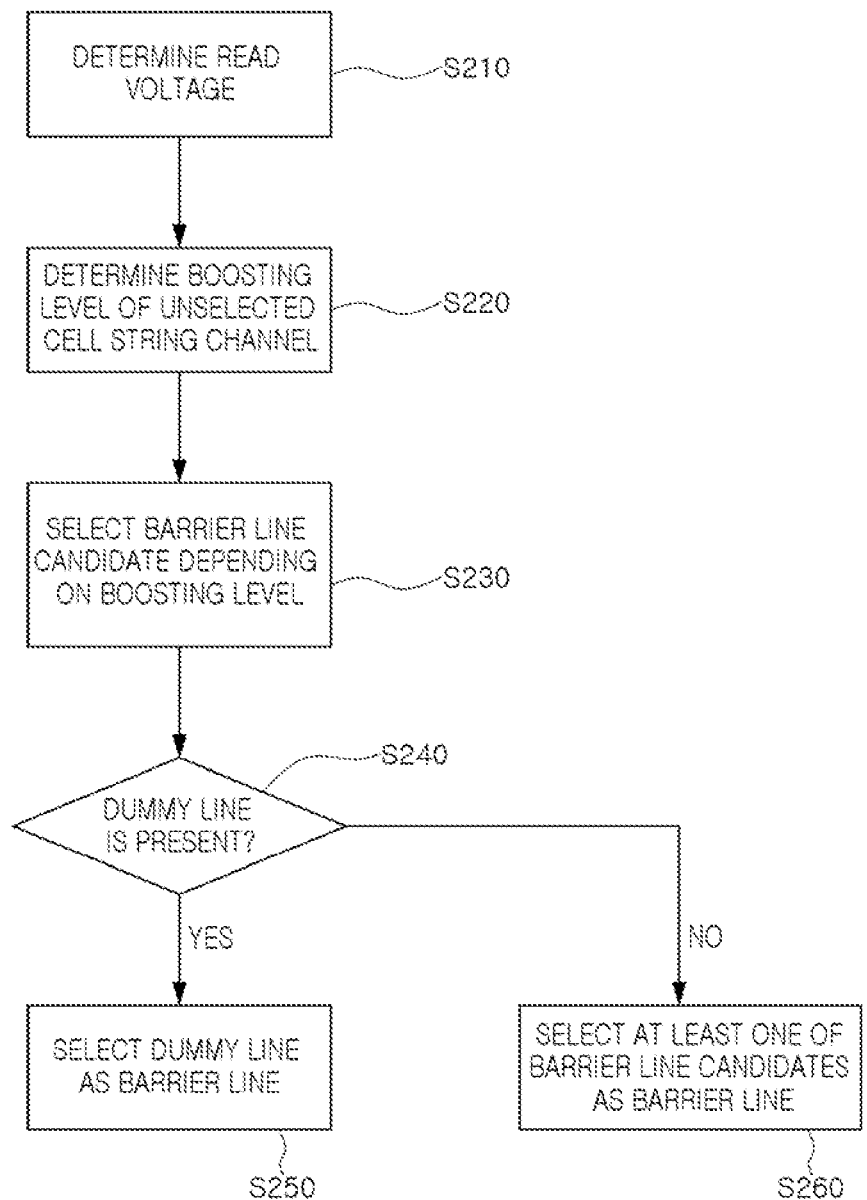

FIGS. 10A and 10B are flowcharts illustrating a method of selecting a barrier line in a memory device according to an example embodiment.

Referring to FIG. 10A, in the memory device, a read voltage input to a selected memory cell may be determined (S110). The read voltage may be a voltage input to a selected wordline connected to a selected memory cell during a read operation, a program verify voltage used in a programming operation using an incremental step pulse programming (ISPP) scheme, an erase verify voltage used during an erase operation, or the like.

In the memory device, a voltage having a predetermined level, significantly decreasing the number of memory cells in which a reading failure may occur, may be determined as a read voltage. For example, a voltage having a predetermined voltage difference from a reference voltage may be determined as a read voltage. The reference voltage may be set and changed based on the degree of deterioration of a memory cell, such as a program/erase cycle (P/E cycle), high temperature stress (HTS), or the like.

In an example embodiment, a read voltage may be determined depending on a reading page of a selected memory cell. For example, when the selected memory cell is a triple-level cell (TLC) capable of storing 3 bits of data, the read voltage may be determined depending on a page to be read, among a most significant bit (MSB) page, a central significant bit (CSB), and a least significant bit (LSB) of the selected memory cell.

In the memory device, a channel boosting level of an unselected cell string may be determined based on the determined read voltage (S120). For example, a voltage level having a predetermined voltage difference from the determined read voltage may be determined to be a channel boosting level of the unselected cell string.

Among a plurality of unselected wordlines, at least one wordline may be selected as a barrier line based on the determined channel boosting level of the unselected cell string (S130). For example, the channel boosting level of the unselected cell string may vary depending on a ratio of the number of wordlines between the unselected string select line and the barrier line to the number of wordlines between the barrier line and the unselected ground select line. In addition, the channel boosting level of the unselected cell string may vary depending on a level of the read pass voltage input to the unselected wordline. Accordingly, at least one barrier line satisfying the channel boosting level determined in S120 may be selected among the unselected wordlines in consideration of a division ratio of wordlines or the level of the read pass voltage.

Referring to FIG. 10B, in the memory device, a read voltage to be input to a selected wordline connected to the selected memory cell may be determined (S210). In addition, the channel boosting level of the unselected cell string may be determined based on the determined read voltage (S220).

At least one of the plurality of unselected wordlines may be selected as a barrier line candidate based on the determined channel boosting level (S230). For example, at least one unselected wordline may be selected as a barrier line candidate in consideration of a division ratio of wordlines, which may obtain the channel boosting level determined in S220, and/or the level of the read pass voltage.

A determination may be made as to whether there is a dummy wordline among selected barrier line candidates and/or wordlines adjacent to the selected barrier line candidates (S240). A plurality of dummy memory cells that are not storing actual data may be connected to the dummy wordline.

When there is a dummy wordline among the barrier line candidate and/or the wordlines adjacent to the barrier line candidate, the dummy wordline may be selected as a barrier line (S250). Meanwhile, when there is no dummy wordline among the barrier line candidates and/or the wordlines adjacent to the barrier line candidate, at least one of the barrier line candidates may be selected as a barrier line (S260). The barrier line selected in S260 may be other than a dummy wordline.

Figure 11:
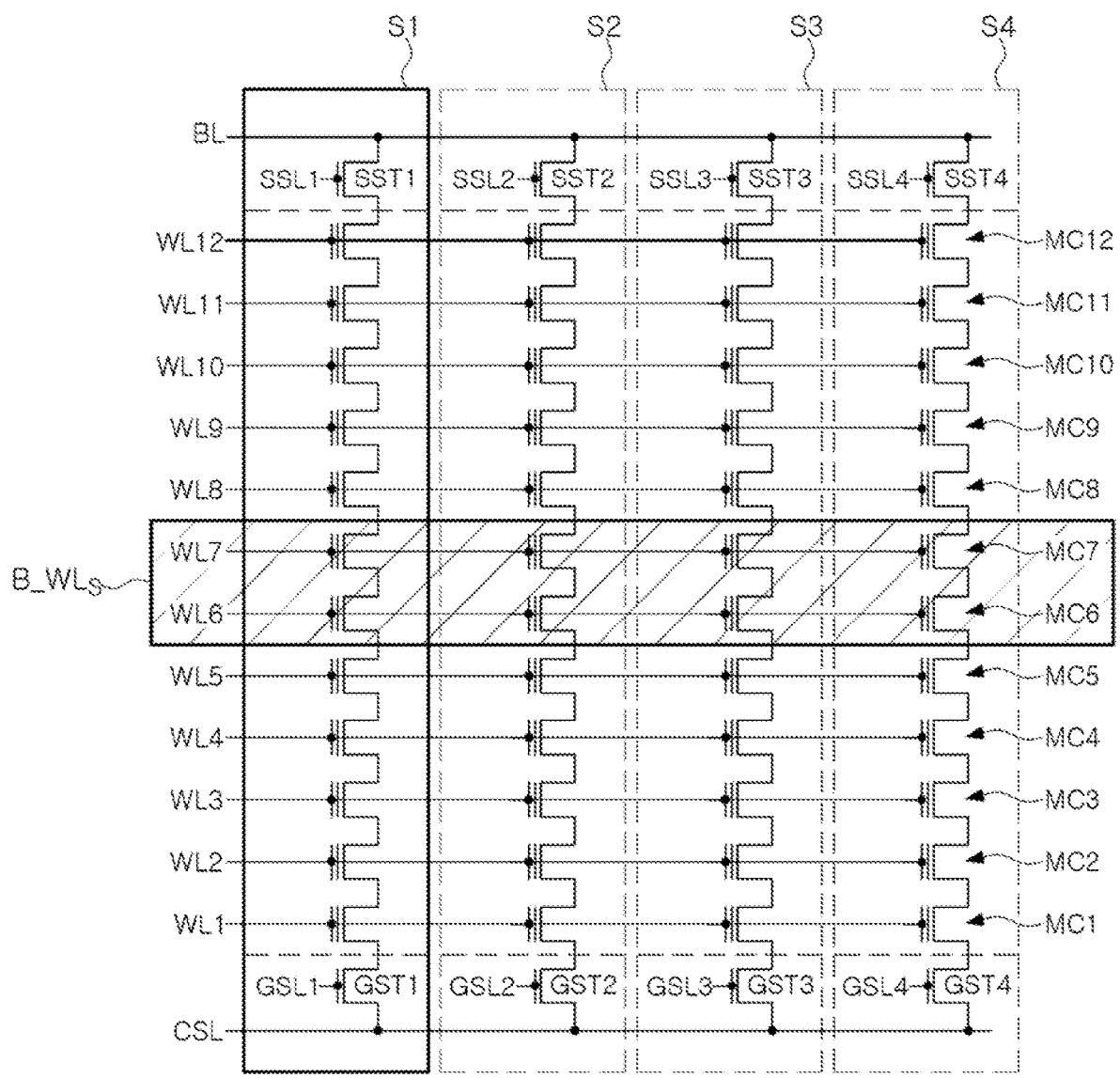
FIGS. 11 to 12B illustrate an operation of a memory device according to an example embodiment.
Figure 12A:
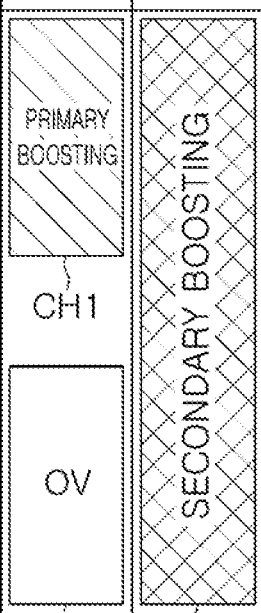
Figure 12B:
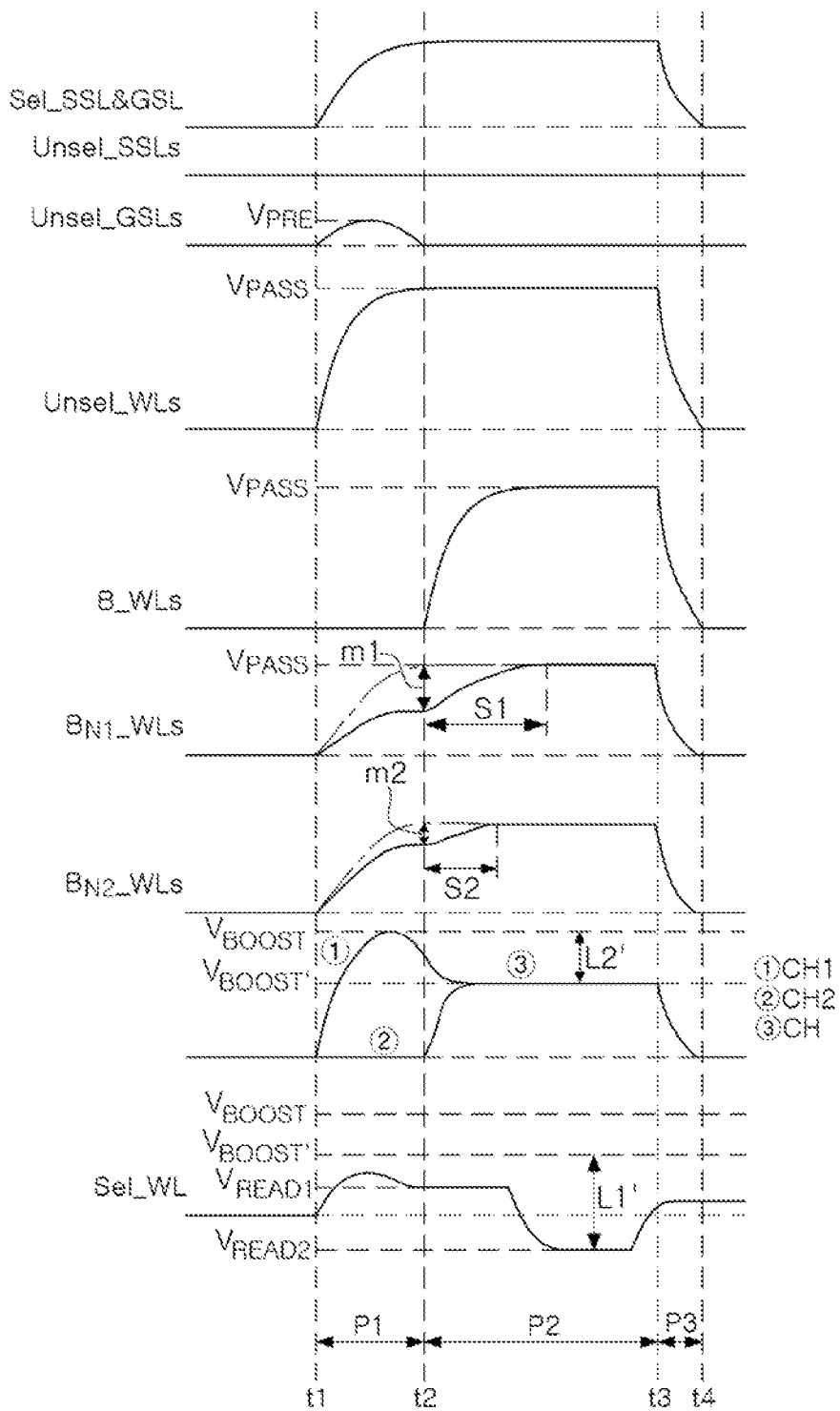

FIGS. 11 to 12B illustrate an operation of a memory device according to an example embodiment.

Referring to FIG. 11, a memory cell array 600 may include a plurality of cell strings S1 to S4. In FIG. 11, the memory cell array 600 is illustrated as including the first to fourth cell strings S1 to S, but a configuration of the memory cell array 60 may be various modified. Each of the first to fourth cell strings S1 to S4 may include a plurality of memory cells MC1 to MC12 connected between string select line SSL1 to SSL4 and ground select line GSL1 to GSL4.

During a read operation and/or a program verify operation, data stored in the selected memory cell may be read by selecting at least one of the first to fourth cell strings S1 to S4 and inputting a read voltage to at least one selected wordline connected to the selected cell string S1 to S4. For example, the read voltage may be input to a twelfth wordline WL12 to read data stored in a twelfth memory cell MC12 connected to the first cell string S1. The read voltage may be input in a read operation as well as in a program verify operation and an erase verify operation.

Among a plurality of unselected wordlines WL1 to WL11 connected to the first cell string S1, at least one unselected wordline may be selected as a barrier lines B_WLs. For example, a sixth wordline WL6 and a seventh wordline WL7 may be selected as barrier lines B_WLs.

A channel of the unselected cell strings S2 to S4 may be logically separated into a plurality of regions in a first period P1 of the read operation by the barrier line B_WLs. In the memory device, a turn-off voltage, for example, a ground voltage may be input to the barrier line B_WLs during the first period P1. In addition, a turn-on voltage, for example, a voltage equal to a read pass voltage may be input to the barrier line B_WLs during the second period P2. On the other hand, a read pass voltage may be input to the other wordlines WL1 to WL5 and WL8 to WL11, except for the selected wordline WL12 and the barrier line B_WLs, among the plurality of wordlines WL1-WL12.

A turn-on voltage may be input to each of the selected string select line SSL1 and the selected ground select line GSL1. In addition, a pre-pulse voltage may be selectively input to either one of the unselected string select lines SSL2 to SSL4 and the unselected ground select lines GSL1 to GSL4 during the first period P1.

To prevent hot-carrier injection (HCI) from occurring in the barrier line B_WLs due to a rapid change in potential around the barrier line B_WLs, a level of the read pass voltage that is input to wordlines adjacent to the barrier line B_WLs may be adjusted. For example, during the first period P1, a level of the read pass voltage that is input to eighth and ninth wordlines WL8 and WL9 (disposed above the barrier line B_WLs) and fourth and fourth wordiness WL4 and WL5 (disposed below the barrier line B_WLs) may be lower than a level of the read pass voltage that is input to the other wordlines. In an example embodiment, the closer a wordline is to the barrier line B_WLs, the more the read pass voltage may be decreased in level, and may be then input. For example, during the first period P1, the read pass voltage may be input to fifth and eighth wordlines WL5 and WL8 closest to the barrier line B_WLs after decreasing by a first value. During the first period P1, the read pass voltage may be input to fourth and ninth wordlines WL4 and WL9 next closest to the barrier line B_WLs after decreasing by a second value less than the first value.

Hereinafter, control signals input to the memory cell array 600, and a change in channel potential of an unselected cell string caused thereby, will be described with reference to FIGS. 12A and 12B.

Referring to both FIGS. 12A and 12B, a predetermined turn-on voltage may input to a first string select line SSL1, a selected string select line Sel_SSL, and a first string select line GSL1, a selected ground select line Sel_GSL.

A predetermined turn-off voltage, for example, a ground voltage, may be input to second to fourth string select lines SSL2 to SSL4, unselected string select lines Unsel_SSLs. A predetermined pre-pulse voltage may be input to second to fourth ground select lines GSL2 to GSL4, unselected ground select lines Unsel_GSLs. In an example embodiment, a maximum value VPRE of the pre-pulse voltage may be about 3 V or higher to 4 V or lower.

A read pass voltages VPASS may be input to first to third wordlines WL1 to WL3 and tenth and eleventh wordlines WL10 and WL11, unselected wordlines Unsel_WLs. A voltage higher than or equal to a predetermined threshold value, for example, the read pass voltage VPASS, may be input to sixth and seventh wordlines WL6 and WL7 selected as barrier lines B_WLs.

A voltage that is input to the fifth and eighth wordlines WL5 and WL8 (the wordlines BN1_WLs that are closest to the barrier line B_WLs) may be lower than the read pass voltage VPASS during at least a portion of the first and second periods P1 and P2. As an example, the voltage input to the fifth and eighth wordlines WL5 and WL8 may lower than the read pass voltage VPASS by a first value m1 at a point in time t1 between the first period P1 and the second period P2.

A voltage that is input to the fourth and ninth wordlines WL4 and WL9 (the wordlines BN2_WLs next closest to the barrier line B_WLs) may be lower than the read pass voltage VPASS during at least a portion of the first and second periods P1 and P2. As an example, a voltage input to the fourth and ninth wordlines WL4 and WL9 may be lower than the read pass voltage VPASS by a second value m2 at the first point in time t1 between the first period P1 and the second period P2. In an example embodiment, the first value m1 may be greater than the second value m2. Accordingly, time S1 for the voltage input to the fifth and eighth wordlines WL5 and WL8 to reach the read pass voltage VPASS may be longer than time S2 for the voltage input to the fourth and ninth wordlines WL4 and WL9 to reach the read pass voltage VPASS.

During the first period P1, a voltage lower than a predetermined threshold value may be input to the barrier line B_WLs to logically separate a channel CH of unselected cell strings SSL2 to SSL4 into a first channel CH1 above the barrier line B_WLs and a second channel CH2 below the barrier line B_WLs.

In the memory device, first boosting may be performed to boost the first channel CH1 and the second channel CH2 during the first period P1. Referring to FIGS. 12A and 12B, during the first period P1, a pre-pulse voltage may be input to only unselected ground select lines Unsel_GSLs, among the unselected string select lines Unsel_SSLs and the unselected string select lines Unsel_GSLs, to boost potential of the first channel CH1 to a predetermined boosting level VBOOST and to maintain potential of the second channel CH2 at a ground level.

In the memory device, second boosting may be performed during the second period P2. Referring to FIGS. 12A and 12B, a voltage higher than or equal to a predetermined threshold value, for example, a read pass voltage VPASS, may be input to the barrier line B_WLs during the second period P2. As the read pass voltage VPASS is input to the barrier line B_WLs, the first channel CH1 and the second channel CH2 may be electrically connected, and the potential of the channel CH may be boosted to a value VBOOST' between the boosting level VBOOST of the first channel CH1 and the ground level, the boosting level of the second channel, during the second period.

In an example embodiment, the boosting level VBOOST' determined to be the potential of the channel CH during a second period may be determined depending on the boosting level VBOOST of the first channel CH1 and the boosting level of the second channel CH2, and a ratio of the number of wordlines corresponding to the first channel CH1 to the number of wordlines corresponding to the second channel CH2. For example, in FIG. 12A, the number of wordlines WL8 to WL12 corresponding to the first channel CH1 is five and the number of wordlines WL1 to WL5 corresponding to the second channel CH2 is five. Accordingly, during the second period P2, the boosting level VBOOST' corresponding to the potential of the channel CH may be determined to be an intermediate value between the boosting level VBOOST of the first channel CH1 and a ground level, the boosting level of the second channel CH2.

As described above with reference to FIGS. 11 to 12B, in the memory device according to an example embodiment, during the first period P, a channel of an unselected cell string may be separated using a barrier line, and a pre-pulse voltage may be selectively input to an unselected string select line or an unselected ground select line. During the second period P2, a voltage higher than or equal to a predetermined value may be input to the barrier line to electrically connect channels that are electrically separated from each other. Therefore, a potential of a channel of the unselected cell string may be reduced as compared with a potential when boosted without selecting and controlling the barrier line, and deterioration of a threshold voltage distribution of a memory cell (for example, caused by occurrence of soft erase) may be prevented. Moreover, in the memory device according to an example embodiment, the pre-pulse voltage may be selectively input to the unselected string select line or the unselected ground select line during the first period P1 to minimize an increase in power consumption and thus allow for reduction in a size of a power supply.

Different from what is described with reference to FIGS. 12A and 12B, in the memory device, a pre-pulse voltage may be input to an unselected string select line. In this case, when the pre-pulse voltage is input to the unselected string select line, a voltage lower than the pre-pulse voltage, for example, a ground voltage may be input to an unselected ground select line. Hereinafter, this will be described with reference to FIGS. 13A and 13B.

Figure 13B:
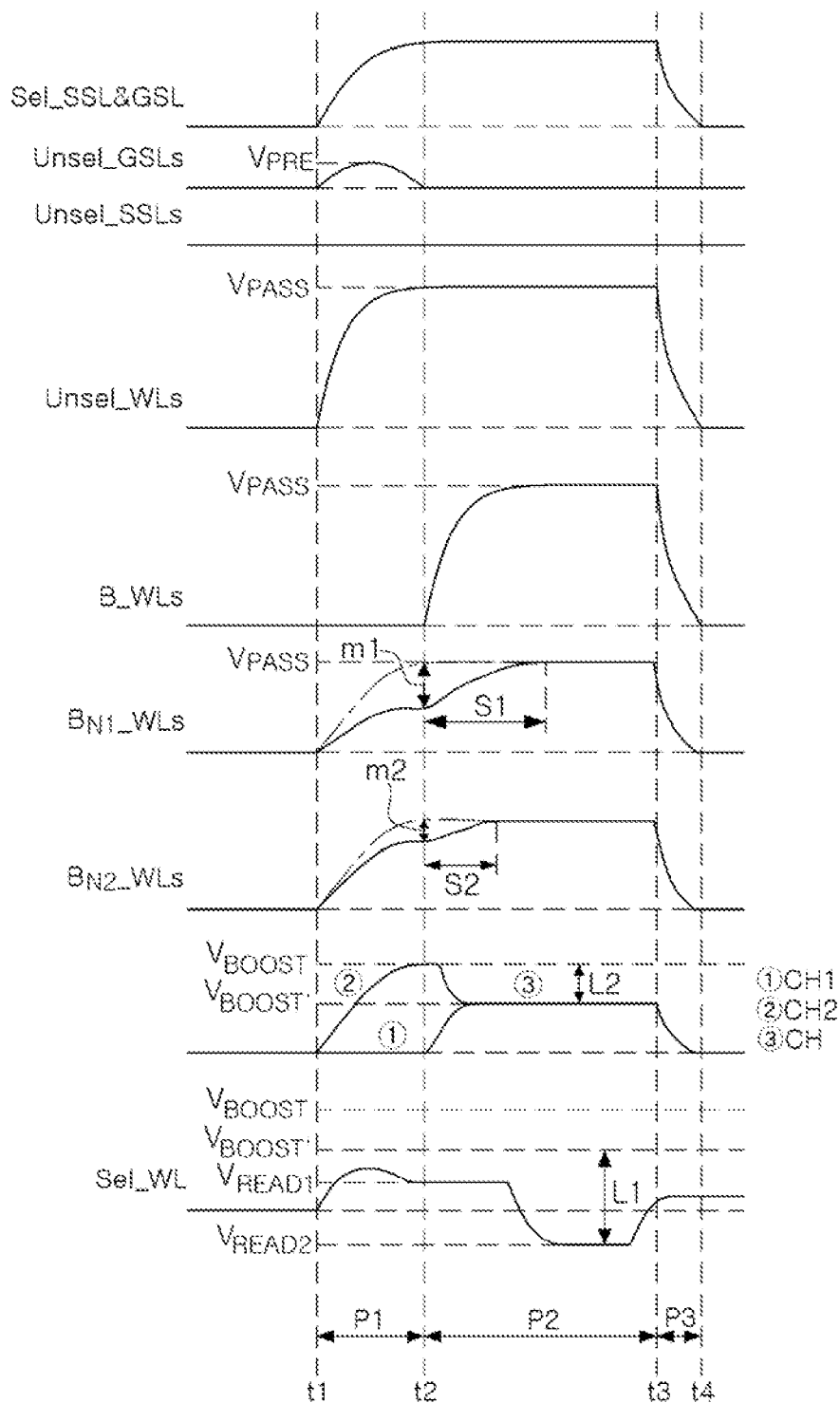

Referring to FIGS. 13A and 13B, during the first period P1, the potential of the first channel CH1 above the barrier line B_WLs may be maintained at a ground level, and the potential of the second channel CH2 below the barrier line B_WLs may be boosted to a predetermined boosting level VBOOST. During the second period P2, as a voltage higher than a predetermined threshold value, for example, a read pass voltage VPASS, is input to the barrier line B_WLs, the first channel CH1 and the second channel CH2 may be electrically re-connected to each other, and potential of the channel CH of the unselected cell string may be boosted to a boosting level VBOOST' higher than a boosting level of the first channel CH1 and lower than a boosting level VBOOST of the second channel CH2. In an example embodiment, the boosting level VBOOST' of the potential of the channel CH of the unselected cell string may be determined depending on the boost level of the first channel CH1 and the boosting level VBOOST of the second channel CH2, and a ratio of the number of wordlines corresponding to the first channel CH1 to the number of wordlines corresponding to the second channel CH2.

Figure 14:
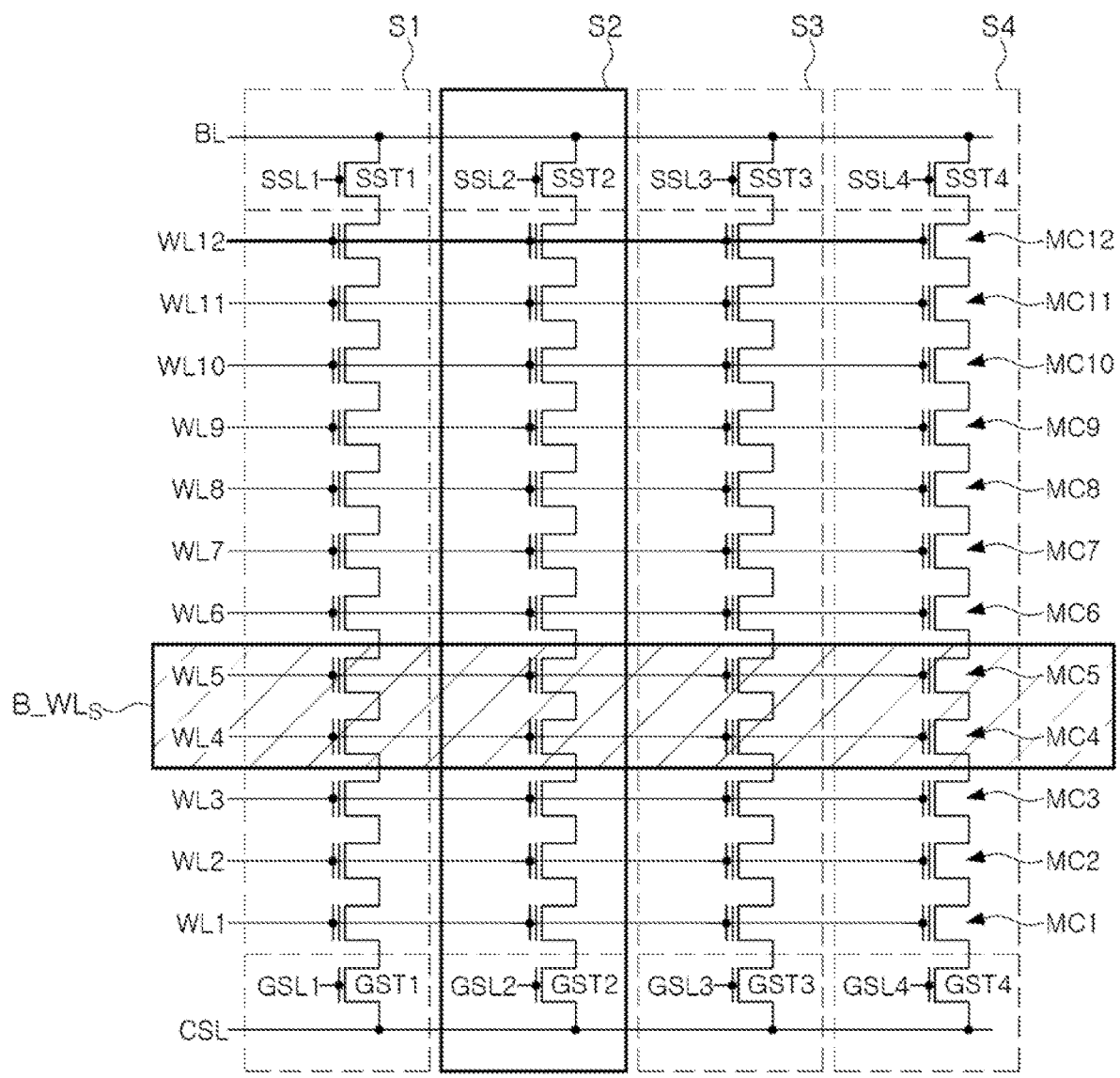
Figure 15B:
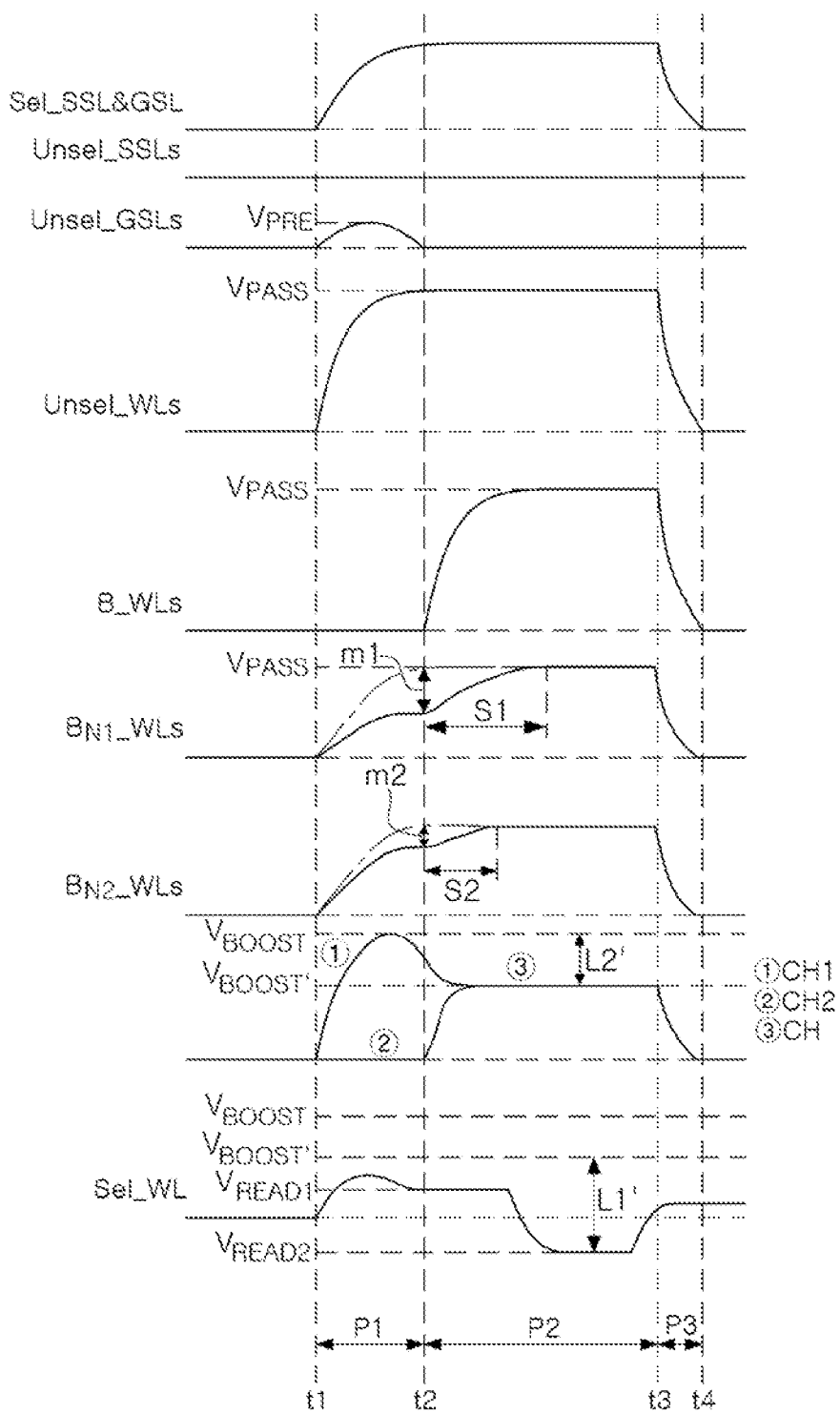

FIGS. 14 to 15B illustrate an operation of a memory device according to an example embodiment.

Referring to FIG. 14, a memory cell array 700 may include first to fourth cell strings S1 to S4. Each of the first to fourth cell strings S1 to S4 may include a plurality of memory cells MC1 to MC12 connected between the string select lines SSL1 to SSL4 and ground select lines GSL1 to GSL4. In FIG. 14, each of the cell strings S1 to S4 is illustrated as including twelve memory cells MC1 to MC12 but each configuration of the cell strings S1 to S4 may be varied.

In the memory device, among a plurality of unselected wordlines WL1 to WL11 connected to the second cell string S2, a selected cell string, one or more unselected wordlines may be selected as barrier lines B_WLs. During at least a portion of a period in a read operation, each channel of the unselected cell strings S1, S3, and S4 may be logically separated into a plurality of channels by the barrier line B_WLs.

In the memory device, a boosting level of the channel included in each of the unselected cell strings S1, S3, and S4 may be determined based on a read voltage input to a twelfth wordline WL12 as a selected wordline. For example, a voltage level having a predetermined voltage difference from the read voltage may be determined to be the boosting level of the channel included in each of the unselected cell strings S1, S3, and S4. At least one of the plurality of unselected wordlines WL1 to WL11 may be selected as a barrier line B_WLs based on the determined boosting level of the each channel of the unselected cell strings S1, S3, and S4. For example, the fourth and fifth wordlines WL4 and WL5 may be selected as barrier lines B_WLs in the example embodiment illustrated in FIG. 14.

In the memory device, a turn-on voltage may be input to the selected string select line SSL2 and the selected ground select line GSL2. A turn-off voltage, for example, a ground voltage, may be input to a barrier line B_WLs during a first period P1. A turn-on voltage, for example, a voltage equal to a read pass voltage, may be input to the barrier line B_WLs during the second period P2. A pre-pulse voltage may be input to unselected string select lines SSL2 to SSL4 or unselected ground select lines GSL2 to GSL4 during the first period P1.

During the first period P1, a channel of the unselected string select lines SSL2 to SSL4 may be electrically separated into a plurality of channels by the barrier line B_WLs. A potential of a portion of channels, among a plurality of channels electrically separated by a selectively input pre-pulse voltage, may be increased to a predetermined boosting level. As a read pass voltage is input to the barrier line B_WLs during a second period P2, the plurality of electrically separated channels may be electrically re-connected to each other. A boosting level of the electrically connected channel may be determined depending on each boosting level of the channels separated by the barrier line B_WLs, a ratio of the numbers of wordlines corresponding to the respective separated channels, and the like. For example, in FIG. 14, since the number of wordlines disposed above the barrier line B_WLs is 7 and the number of wordlines disposed below the barrier line B_WLs is 3, a boosting level of a channel during the second period P2 may have a value obtained by summing the boosting levels of the channels, separated based on the barrier line B_WLs during the first period P1, at a ratio of 7:3. As described above, in the memory device according to an example embodiment, a location of the barrier line B_WLs may be adjusted to control a boosting level of a channel of unselected string select lines to a desired value.

Referring to both FIGS. 15A and 15B, a predetermined turn-on voltage may be input to a second string select line SSL2, a selected string select line Sel_SSL, and a second ground select line GSL2, a selected ground select line Sel_GSL.

A turn-off voltage, for example, a ground voltage, may be input to first, third, and fourth string select lines SSL1, SSL3, and SSL4, as unselected string select lines Unsel_SSLs. A pre-pulse voltage may be input to first, third, and fourth ground select lines GSL1, GSL3, and GSL4, as unselected ground select lines Unsel_GSLs. In an example embodiment, a maximum value VPRE of the pre-pulse voltage may be about 3 V or higher to 4 V or lower.

A read pass voltages VPASS may be input to first to third wordlines WL1 to WL3 and the sixth to eleventh wordlines WL6 and WL11, as unselected wordlines Unsel_WLs. A turn-off voltage, for example, a ground voltage may input to fourth and fifth wordlines WL4 and WL5 selected as the barrier line B_WLs during the first period P1, and a read pass voltage VPASS may be input to the fourth and fifth wordlines WL4 and WL4 during the second period P2.

A voltage input to the third and sixth wordlines WL3 and WL6, which are wordlines BN1_WLs closest to the barrier line B_WLs, may be lower than the read pass voltage VPASS during at least a portion of the first and second periods P1 and P2. As an example, the voltage input to the third and sixth wordlines WL3 and WL6 may be lower than the read pass voltage VPASS by a first value m1 at a first point in time t2 between the first and second periods P1 and P2.

A voltages input to the second and seventh wordlines WL2 and WL7, which are unselected wordlines BN2_WLs next closest to the barrier line B_WLs, may be lower than the read pass voltage VPASS during at least a portion of the first and second periods P1 and P2. As an example, the voltage input to the second and seventh wordlines WL2 and WL7 may be lower than the read pass voltage VPASS by a second value m2 at the first point in time t2 between the first and second periods P1 and P2. In an example embodiment, the first value m1 may be greater than the second value m2. Accordingly, time S1 for the voltage input to the third and sixth wordlines WL3 and WL6 to reach the read pass voltage VPASS may be longer than time S2 for the voltage input to the second and seventh wordlines WL2 and WL7 to reach the read pass voltage VPASS.

During the first period P1, the channel CH of the unselected cell strings SSL1, SSL3, and SSL4 may be logically separated into a first channel CH1 and a second channel CH2 by the barrier line B_WLs. The first channel CH1 may be primarily boosted to a first boosting level VBOOST, and the second channel CH2 may be maintained at a second boosting level, lower than the first boosting level VBOOST, for example, a ground level (a ground state).

As the same voltage as other unselected wordlines Unsel_WLs, for example, the read pass voltage VPASS, is input to the barrier line B_WLs during the second period, the first channel CH1 and the second channel CH2 may be merged into a single channel CH. As a result, the merged channel CH may be secondarily boosted to an intermediate value VBOOST' between the first boosting level VBOOST of the first channel CH1 and a boost boosting level (0 V) of the second channel CH2.

In an example embodiment, a boosting level of the merged channel CH may be calculated by summing the boosting level VBOOST of the first level and the boosting level (0 V) of the second channel CH2 depending on a ratio of the number of wordlines corresponding to the first channel CH1 to the number of wordlines corresponding to the second channel CH2. For example, in FIG. 15A, the number of unselected wordlines WL6 to WL12 corresponding to the first channel CH1 is seven and the number of unselected wordlines WL1 to WL3 corresponding to the second channel CH2 is three. Accordingly, during the second period P2, the boosting level VBOOST' of the merged channel CH may have a value obtained by summing the first boosting level VBOOST of the first channel CH1 and a boost boosting level (0 V) of the second channel CH2 at a ratio of 7:3

Different from what is illustrated in FIGS. 11 to 15B, the barrier lines B_WLs may be selected as a plurality unselected wordlines spaced apart from each other. This will be described in detail with reference to FIGS. 16 to 17B.

Figure 16:
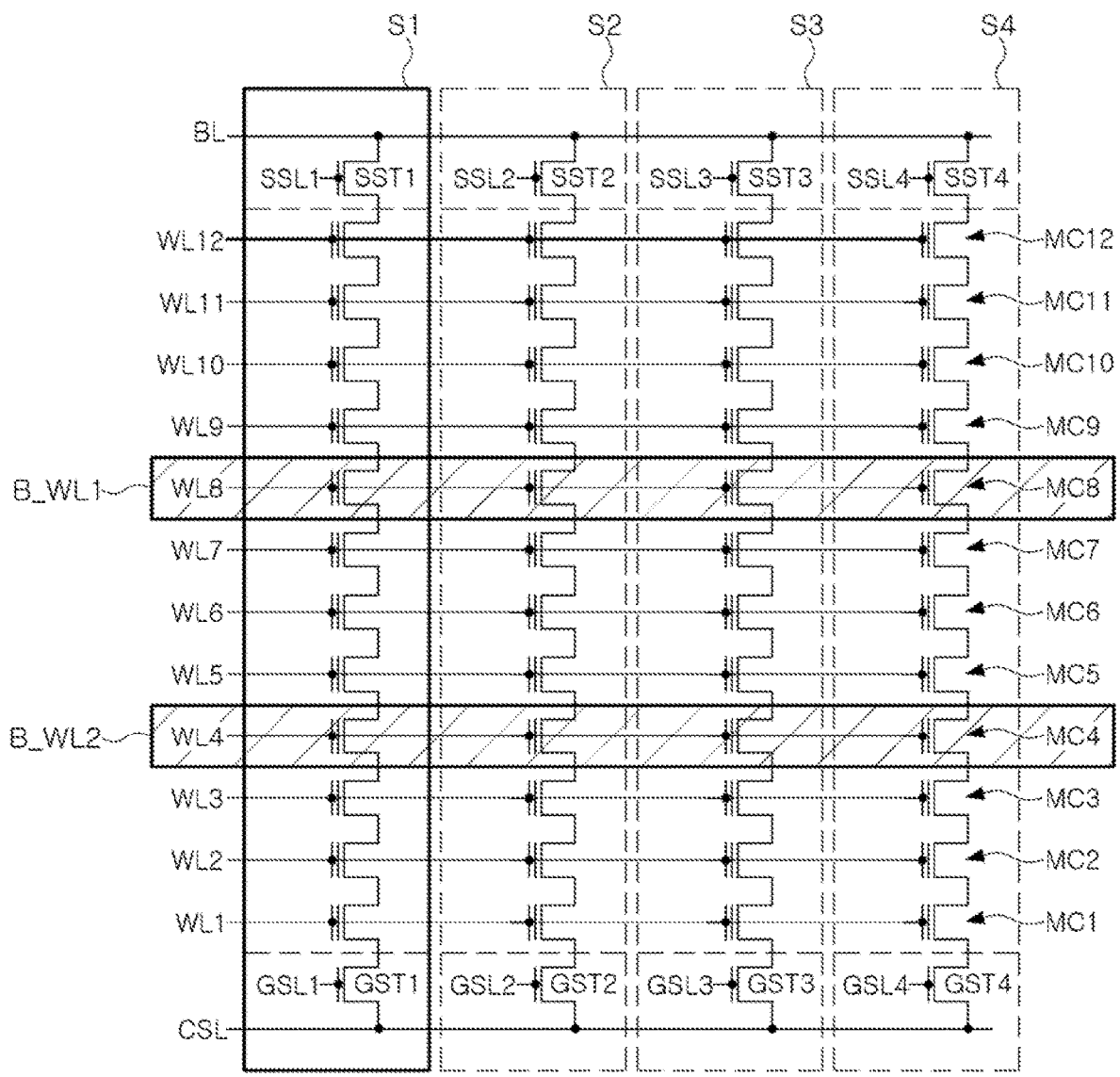
Figure 17B:
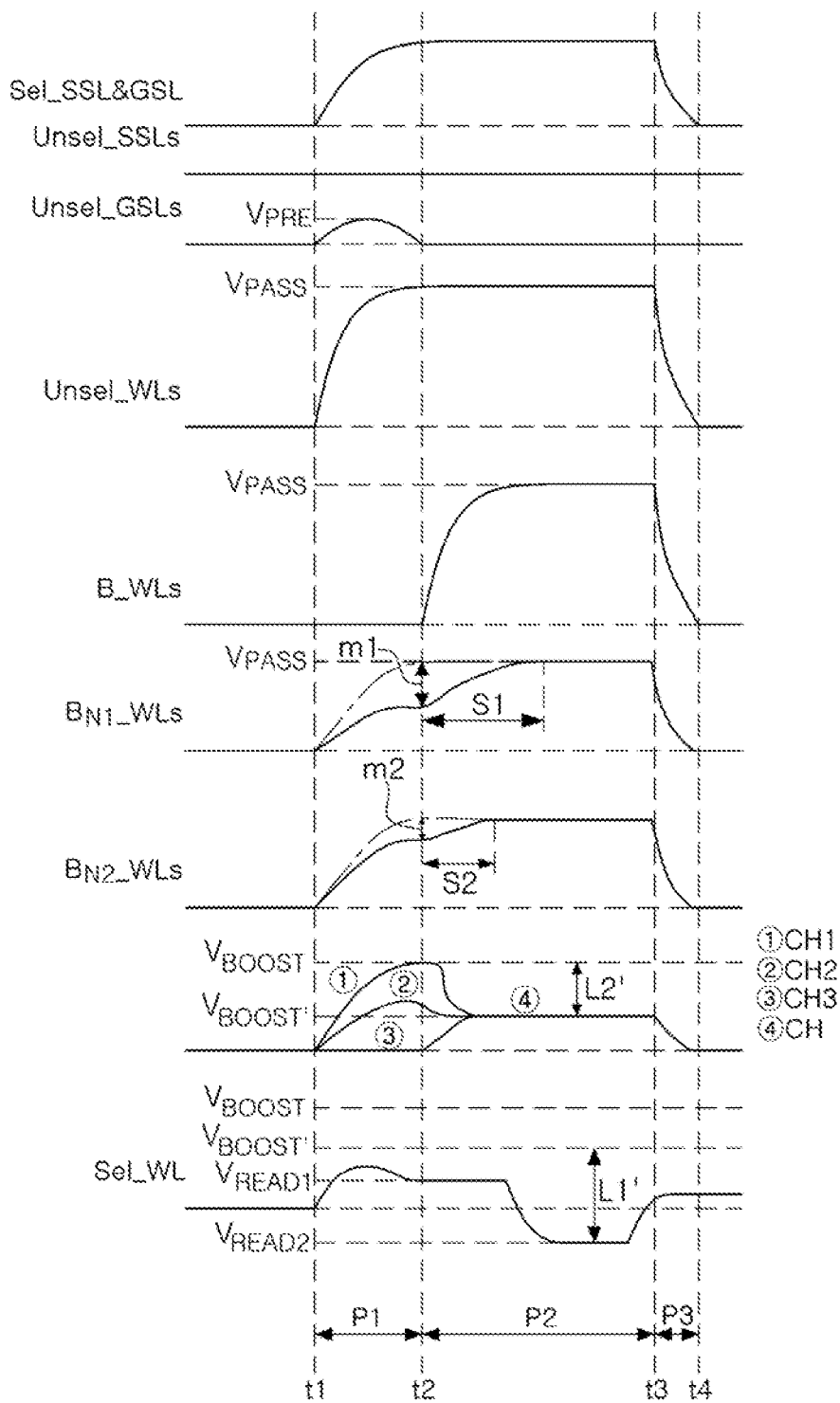

FIGS. 16 to 17B illustrate an operation of a memory device according to an example embodiment.

Referring to both FIGS. 16 to 17B, a memory device according to an example embodiment may include a plurality of wordlines WL1 to WL12. Among the plurality of wordlines WL1 to WL12, a plurality of wordlines spaced apart from each other may be selected as barrier lines B_WLs. For example, in FIG. 16, an eighth wordline WL8 may be selected as a first barrier line B_WL1, and a fourth wordline WL4 may be selected as a second barrier line B_WL2.

A channel of a plurality of unselected cell strings S2 to S4 may be logically separated into first to third channels CH1 to CH3 by the first barrier line B_WL1 and the second barrier line B_WL2 during a first period P1.

During a first period P1, a ground voltage may be input to unselected string select lines SSL2 to SSL4, a pre-pulse voltage may be input to unselected ground select lines GSL2 to GSL4, and the first channel CH1 may be primarily boosted to a first boosting level VBOOST1. The second channel CH2 may be primarily boosted to a second boosting level VBOOST2, and the third channel CH3 may be primarily boosted to a third boosting level VBOOST3. In an example embodiment, each of the first to third boosting levels VBOOST1 to VBOOST3 may be in proportion to the number of wordlines corresponding to each of the first to third channels CH1 to CH3.

During a second period P2, functions of the first barrier line B_WL1 and the second barrier line B_WL2 may be deactivated to merge the first to third channels CH1 to CH3 into a single channel CH. In this case, a boosting level VBOOST' of the merged channel CH may have a value obtained by summing the boosting levels VBOOST1 to VBOOST3 of the first to third channels CH1 to CH3 in proportion to the number of wordlines thereof.

Figure 18:
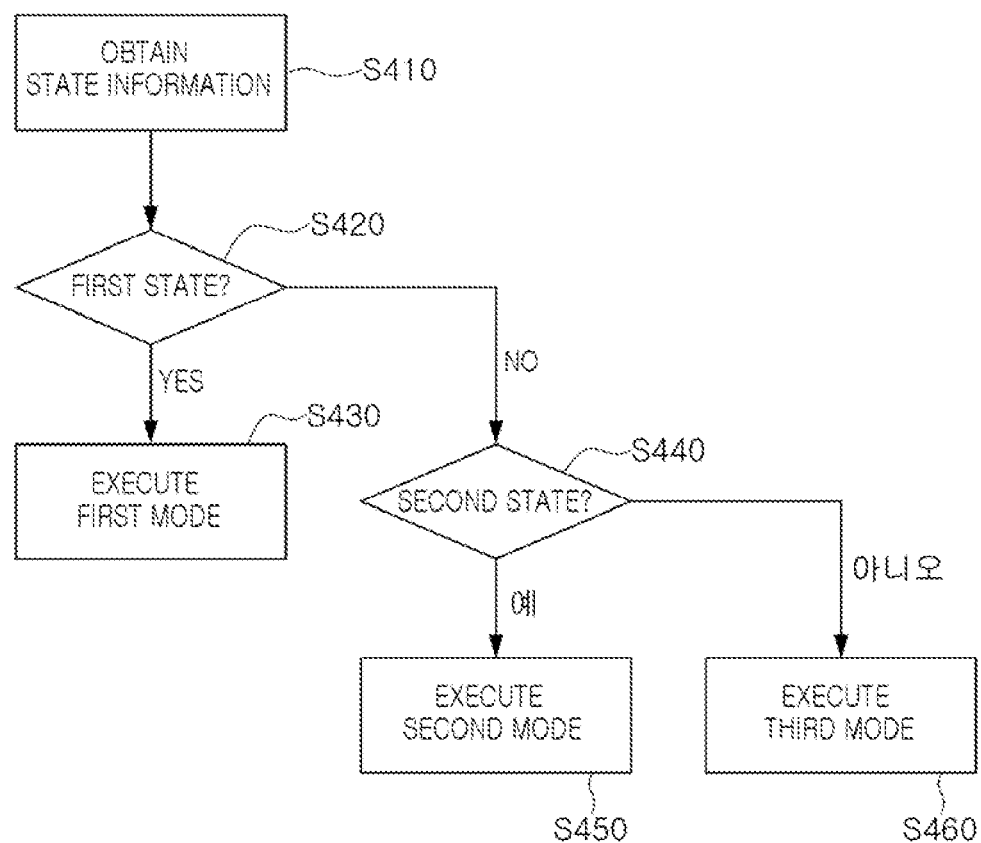
FIG. 18 is a flowchart illustrating an operating method of a memory device according to an example embodiment.

FIG. 18 is a flowchart illustrating an operating method of a memory device according to an example embodiment.

Referring to FIG. 18, a memory device according to an example embodiment may operate in one mode among first to third modes during a read operation and/or a program verify operation.

The memory device may obtain state information (which may be stored in an external memory, an internal buffer, or the like) in real time or every predetermined period to determine an operating mode (S410). The state information may include information on the degree of deterioration of the memory device, an operating state, and the like. For example, the state information of the memory device may include information such as a program/erase (P/E) cycle, the number of reading retry times, a retention time, and the number of error bits in a memory cell. The state information may include environmental information, such as an operating temperature, or a supply level of external power.

In an embodiment, a state of the memory device may be classified into first to third states depending on a predetermined criterion. As an example, the first state may refer to a state in which operating voltages may not be normally generated due to poor supply of power to the memory device. The second state may refer to a state in which the degree of deterioration of the memory device is high, so that a reading failure, or the like, may occur. The third state may refer to a common state in which a programming operation, a read operation, or the like, may be normally performed.

A determination may be made as to whether a current state of the memory device is the first state among the first to third states (S420). In certain examples, a determination may be made as to whether the memory device is in the first state based on a result of comparing the supply level of the external power obtained in S410 with a predetermined threshold value.

When the result determined in S420 is that the memory device is in the first state, a first mode may be executed (S430). In the first mode, a barrier line may not be selected and a pre-pulse voltage may be not input to both unselected string select lines and unselected ground select lines. An operating method of the memory device in the first mode is the same as described above with reference to FIG. 6.

Since the pre-pulse voltage is not input to both the unselected string select lines and the unselected ground select lines in the first mode, power consumption may be significantly reduced. Accordingly, the first mode may be effective in a state in which a power state of the memory device is relatively poor.

When the result determined in S420 is that the memory device is not in the first state, a determination may be made as to whether the current state of the memory device is in the second state (S440). In certain examples, a determination may be made as to whether the memory device is in the second state depending on whether the P/E cycle obtained in S410 is greater than a predetermined threshold value.

When the result determined in S440 is that the memory device is in the second state, a second mode may be executed (S450). In the second mode, the barrier line may not be selected and the pre-pulse voltage may be input to both the unselected string select lines and the unselected ground select lines. An operating method of the memory device in the second mode is the same as described above with reference to FIG. 8.

Since the pre-pulse voltage is input to both the unselected string select lines and the unselected ground select lines in the second mode, power consumption may be increased. However, channel potential of an unselected cell string may be further decreased to completely prevent soft erase. Therefore, the second mode may be most effective in terms of reliability. The second mode may mainly operate in a state in which the degree of deterioration of the memory device is relatively high.

When the result determined in S440 is that the memory device is not in the second state (for example, is in the third state), a third mode may be executed (S460). In the third mode, the barrier line may be selected and the pre-pulse voltage may be selectively input to the unselected string select lines or the unselected ground select lines, as described above with reference to FIGS. 9 to 17B. The third mode may mainly operate in a state in which the degree of deterioration of the memory device is low to medium.

In the third mode, channel potential of an unselected cell string may be limited to a predetermined level to prevent soft erase and to secure reliability of the memory device. In addition, the pre-pulse voltage may be selectively input to the unselected string select lines or the unselected ground select lines to significantly reduce power consumption and an increase in a size of the power supply. As a result, the second mode may be effective in a system that demands both low power and high reliability, for example, a mobile system.

Figure 19:
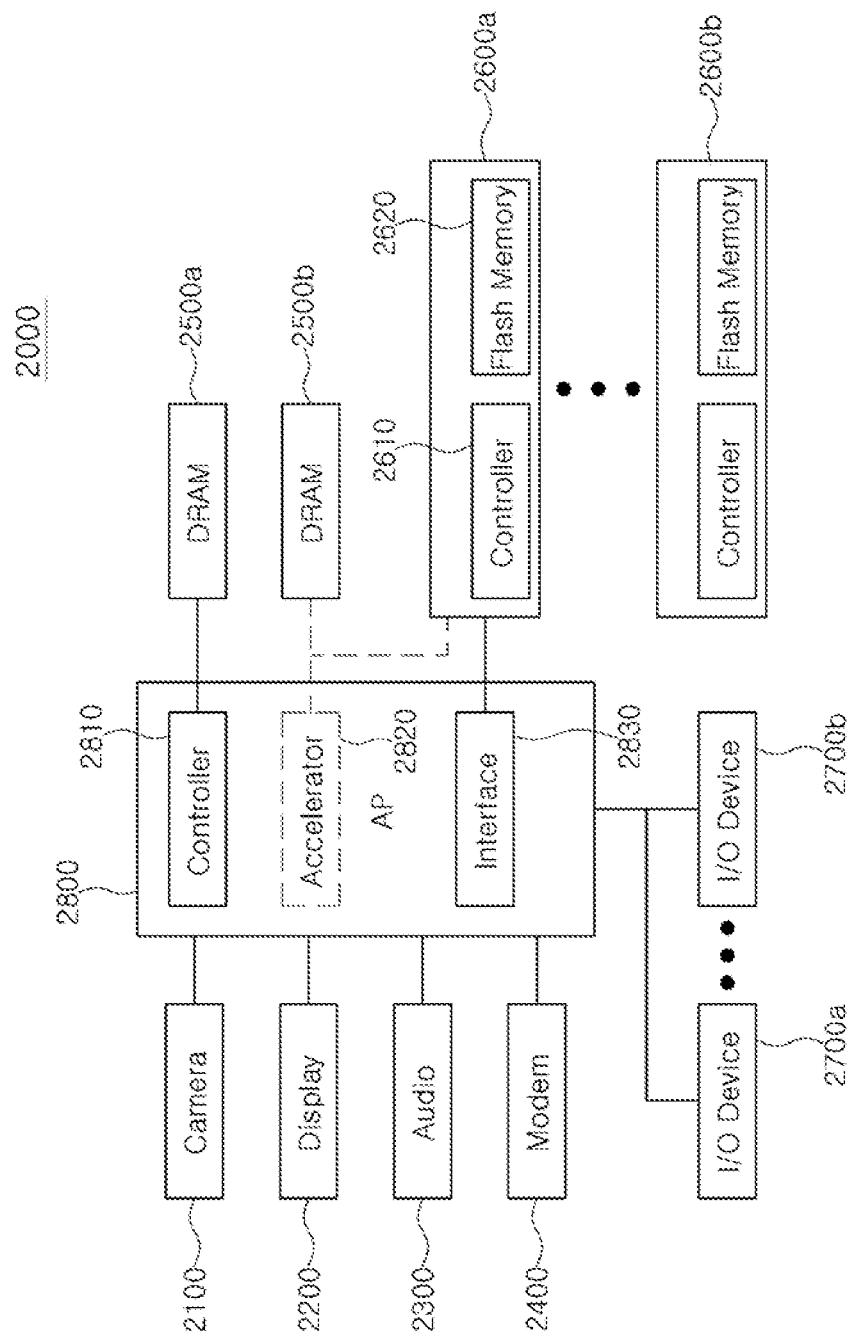
FIG. 19 illustrates a mobile system including a memory device according to a memory device according to an example embodiment.

FIG. 19 illustrates a mobile system including a memory device according to a memory device according to an example embodiment.

Referring to FIG. 19, a mobile system 1000 may include a camera 2100, a display 2200, an audio processor 2300, a modem 2400, DRAMs 2500a and 2500b, and flash memory devices 2600a and 2600b, input/output (I/O) devices 2700a and 2700b, and an application processor (AP) 2800.

The mobile system 2000 may be implemented as a laptop computer, a mobile phone, a smartphone, a tablet personal computer (table PC), a wearable device, a healthcare device, or an Internet-of-Things (IoT) device. Also, the mobile system 2000 may be implemented as a server or a PC.

The camera 2100 may capture a still image or a video under the user's control. In an example embodiment, the camera 2100 may transmit data such as still image/video to the AP 2800 according to a D-PHY or C-PHY interface defined in the MIPI Standard. The mobile system 2000 may obtain specific information using a still image/video captured by the camera 2100, or may convert and store the still image/video into other types of data such as text. In another implementation, the mobile system 2000 may recognize a character string included in the still image/video captured by the camera 2100, and may provide a text or audio translation corresponding to the character string. As described above, the camera 1100 in the mobile system 1000 tends to be used in various fields of application.

The display 2200 may be implemented in various forms such as a liquid crystal display (LCD), an organic light emitting diodes (OLED) display, an active-matrix organic light emitting diodes (AMOLED) display, a plasma display panel (PDP), a field emission display (FED), an electronic paper, and the like. In an example embodiment, the display 1200 may provide a touchscreen function to be also used as an input device of the mobile system 2000. In addition, the display 2200 may be integrated with a fingerprint sensor, or the like, to provide a security function of the mobile system 2000.

The audio processor 2300 may process audio data, stored in flash memory devices 2600*a* and 2600*b*, or audio data included in contents externally received through a modem 2400 or the I/O devices 2700*a* and 2700*b*. For example, the audio processor 2300 may perform various processes such as coding/decoding, amplification, and noise filtering, or the like, on the audio data.

The modem 2400 may modulate a signal and transmit the modulated signal to transmit and receive wired/wireless data, and may demodulate an externally received signal to restore an original signal. The I/O devices 2700*a* and 2700*b* may provide digital input and output, and may include an input device, such as a port connectable to an external recording medium, a touchscreen, or a mechanical button key, and an output device, capable of outputting a vibration in a haptic manner. In certain examples, the I/O devices 1700*a* and 1700*b* may be connected to an external recording medium through a port such as a USB, a Lightning cable, an SD card, a micro SD card, a DVD, a network adapter, or the like.

The AP 2800 may control the overall operation of the mobile system 2000. Specifically, the AP 2800 may control the display 2200 to display a portion of the contents, stored in the flash memory devices 2600*a* and 2600*b*, on a screen. In an example embodiment, the AP 2800 may transmit image data to be displayed on the display 2200 to the display 2200 according to the D-PHY or C-PHY interface defined in the MIPI standard. In addition, when a user input is received through the I/O devices 2700*a* and 2700*b*, the AP 2800 may perform a control operation corresponding to the user input.

The AP 2800 may be provided as a system-on-chip (SoC) driving an application program, an operating system (OS), or the like. In addition, the AP 2800 may be included in a single semiconductor package together with other devices included in the mobile system 1000, for example, a DRAM 2500*a*, a flash memory 2620, and/or a memory controller 2610. For example, the AP 2800 and at least one device may be provided in a package form such as Package on Package (PoP), Ball grid arrays (BGAs), Chip scale packages (CSPs), System In Package (SIP), Multi Chip Package (MCP), Wafer-level Fabricated Package (WFP), Wafer-Level Processed Stack Package (WSP), or the like.

A kernel of the operating system, driven on the AP 2800, may include an input/output scheduler and a device driver for controlling the flash memory devices 2600*a* and 2600*b*. The device driver may control access performance of the flash memory devices 2600*a* and 2600*b* with reference to the number of synchronous queues managed by the input/output scheduler, or may control a CPU mode inside the SoC, a dynamic voltage and frequency scaling (DVFS) level, and the like.

In an example embodiment, the AP 2800 may include a processor block, executing an operation or driving an application program and/or an operating system, and various other peripheral elements connected to the processor block through a system block and a system bus. The peripheral elements may include a memory controller, an internal memory, a power management block, an error detection block, a monitoring block, and the like. The processor block may include one or more cores. When a plurality of cores are included in the processor block, each of the cores includes a cache memory and a common cache, shared by the cores, may be included in the processor block.

In an example embodiment, the AP 2800 may include an accelerator block 2820, a specific-purpose circuit for AI data operation. In another implementation, according to example embodiments, a separate accelerator chip may be provided to be separated from the AP 2800, and a DRAM 2500*b* may be additionally connected to the accelerator block 2820 or the accelerator chip. The accelerator block 2820 may be a functional block specialized in performing specific functions of the AP 2800, and may include a graphics processing unit (GPU) serving as a functional block specialized in processing graphics data, a neural processing unit (NPU) serving as a functional block specialized in performing AI computation and interference, a data processing unit (DPU) serving as a functional block specialized in transmitting data, or the like.

According to an example embodiment, the mobile system 1000 may include a plurality of DRAMs 2500*a* and 2500*b*. In an example embodiment, the AP 2800 may include a controller 2810 for controlling the DRAM 1500*a* and 1500*b*, and the DRAM 2500*a* may be directly connected to the AP 2800.

The AP 2800 may set a command and a mode register set (MRS) command according to the JEDEC standard to control a DRAM, or may set specifications and functions used by the mobile system 2000, such as a low voltage, high speed, and reliability, and a DRAM interface protocol for CRC/ECC to perform communication. For example, the AP 2800 may communicate with the DRAM 2500*a* through an interface, conforming to the JEDEC standards, such as LPDDR4, LPDDR5, or the like. In another implementation, the AP 2800 may set a new DRAM interface protocol to control the DRAM 1500*b* for an accelerator, in which an accelerator block 1820 or an accelerator chip provided independently of the AP 1800 has a higher bandwidth than the DRAM 1500*a*, to perform communication.

Only the DRAMs 2500*a* and 2500*b* are illustrated in FIG. 17, but a configuration of the mobile system 1000 may be varied. According to bandwidth and reaction speed of the AP 2800 or the accelerator block 2820, voltage conditions, or the like, memories other than the DRAMS 2500*a* and 25000*b* may also be included in the mobile system 2000. As an example, the controller 2810 and/or the accelerator block 2820 may control various memories such as PRAM, SRAM, MRAM, RRAM, FRAM, Hybrid RAM, and the like. The DRAMs 2500*a* and 2500*b* have relatively lower latency and higher bandwidth than I/O devices 2700*a* and 2700*b* or flash memory devices 2600*a* and 2600*b*. The DRAMs 2500*a* and 2500*b* may be initialized at a point in time when the mobile system 2000 is powered on. When an operating system and application data are loaded, the DRAMs 2500*a* and 2500*b* may be used as temporary storages, in which the operating system and application data are temporarily stored, or as spaces in which various software codes are executed.

Four fundamental arithmetic operations such as addition, subtraction, multiplication, and division and a vector operation, an address operation, or Fast Fourier Transform (FFT) operation data may be stored in the DRAMs 2500*a* and 2500*b*. In another example embodiment, the DRAMs 2500*a* and 2500*b* may be provided as a processing in memory (PIM) having an operational function. As an example, a function used in inference may be performed in the DRAMs 2500*a* and 2500*b*. In this case, the inference may be performed in a deep learning algorithm using an artificial neural network. The deep learning algorithm may include a training step, in which a model is learned through various data, and an inference step in which data is recognized with the trained model. For example, a function used in the inference may include a hyperbolic tangent function, a sigmoid function, a rectified linear unit (ReLU) function, or the like.

As an example embodiment, an image captured by a user through the camera 2100 may be signal-processed and stored in the DRAM 2500b, and the accelerator block 2820 or the accelerator chip may perform an AI data operation using the data stored in the DRAM 2500b and the function used in the inference to recognize data.

According to an example embodiment, the mobile system 2000 may include a plurality of storage or a plurality of flash memory devices 2600a and 2600b having capacity higher than capacity of the DRAMs 2500a and 2500b.

The flash memory devices 2600a and 2600b may include a memory controller 2610 and a flash memory 2620. The memory controller 2610 may receive a control command and data from the AP 2800, and may write data to the flash memory 2620 in response to the control command or may read data stored in the flash memory 2620 and transmit the read data to the AP 2800. A pre-pulse scheme, described with reference to example embodiments, may be applied to a procedure in which a writing operation of writing data into the flash memory 2620 is verified or data is read from the flash memory 2620. As an example, a channel boosting level of the flash memory 2620 may be reduced to improve reliability of the flash memory 2620. In addition, a pre-pulse voltage may be selectively applied to an unselected string select line or an unselected ground select line of the flash memory 2620 to reduce power consumption.

According to an example embodiment, the accelerator block 2820 or the accelerator chip may perform a training step and an AI data operation using the flash memory devices 2600a and 2600b. In an example embodiment, a block capable of performing a predetermined operation may be implemented in the flash memory devices 2600a and 2600b. Instead of the AP 2800 and/or the accelerator block 2820, the operational logic may perform at least a portion of the training step and the AI data operation, performed by the AP 2800 and/or the accelerator block 2820, using the data stored in the flash memory 2620.

In an example embodiment, the AP 2800 may include an interface 2830. Accordingly, the flash memory devices 2600a and 2600b may be directly connected to the AP 2800. For example, the AP 2800 may be implemented as an SoC, the flash memory device 2600a may be implemented as a chip independently of the AP 2800, and the AP 2800 and the flash memory device 2600a may be mounted in a single package. However, example embodiments are not limited thereto, and the plurality of flash memory devices 2600a and 2600b may be electrically connected to the mobile system 2000 through a connection.

The flash memory devices 2600a and 2600b may stores data such as a still image/video, captured by the camera 2100, or data received through a communications network and/or a port included in the I/O devices 2700a and 2700b. For example, the flash memory devices 2600a and 2600b may store augmented reality/virtual reality, high definition (HD) or ultra high definition (UHD) contents.

Figure 20:
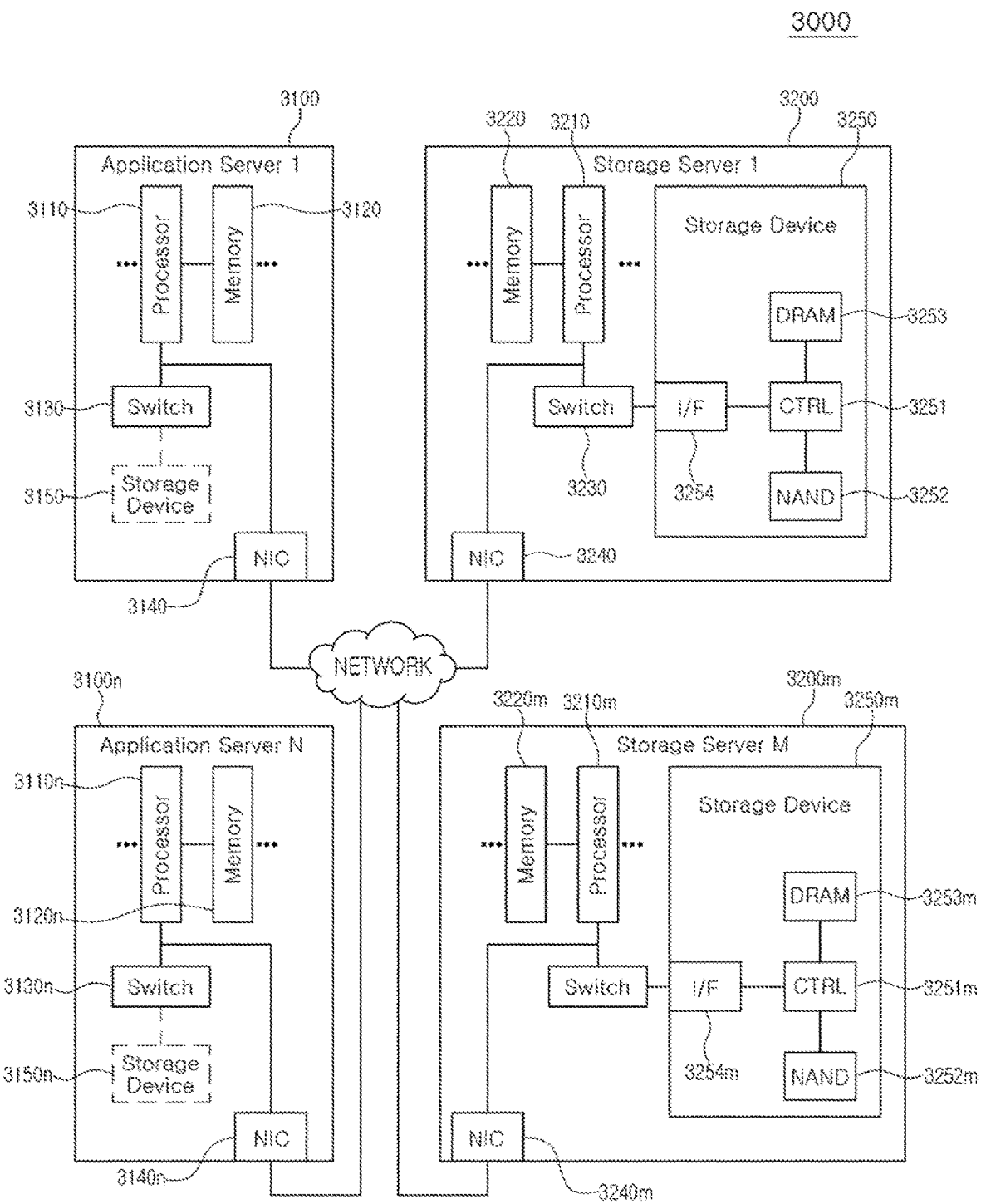
FIG. 20 illustrates a data center including a memory device according to an example embodiment.

FIG. 20 illustrates a data center including a memory device according to an example embodiment.

Referring to FIG. 20, a data center 3000 is a facility for collecting various types of data and providing services, and may be referred to as a data storage center. The data center 3000 may include application servers 3100 to 3100n and storage servers 3200 to 3200m. The number of application servers 3100 to 3100n and the number of storage servers 3200 to 3200m may be variously selected according to example embodiments, and the number of the application servers 3100 to 3100n and the number of the storage servers 3200 to 3200m may be different from each other.

The application server 3100 or the storage server 3200 may include at least one of the processors 3110 and 3210 and the memories 3120 and 3220. A description will be given with respect to the storage server 3200 as an example. The processor 3210 may control the overall operation of the storage server 3200, and may access the memory 3220 to execute an instruction and/or data loaded in the memory 3220. According to an example embodiment, the number of processors 3210 included in the storage server 3200 and the number of memories 322 included in the storage server 3200 may be variously selected. In an example embodiment, the processor 3210 and memory 3220 may provide a processor-memory pair. In an example embodiment, the number of the processors 3210 and the number of the memories 3220 may be different from each other. The processor 3210 may include a single-core processor or a multi-core processor. The above description of the storage server 3200 may be similarly applied to the application server 3100. According to an example embodiment, the application server 3100 may not include the storage device 3150. The storage server 3200 may include at least one storage device 3250. The number of storage devices 3250, included in the storage server 3200, may be variously selected according to example embodiments.

The application servers 3100 to 3100n and the storage servers 3200 to 3200m may communicate with each other through a network 3300. The network 3300 may be implemented using a Fibre Channel (FC) or an Ethernet network. In this case, the FC may be a medium used in relatively high-speed data transmission, and may use an optical switch providing high performance/high availability. The storage servers 3200 to 3200m may be provided as a file storage, a block storage, or an object storage depending on an access manner of the network 3300.

In an example embodiment, the network 1300 may be a storage-only network such as a storage area network (SAN). As an example, the SAN may be an FC-SAN using an FC network and implemented depending on an FC Protocol (FCP). As another example, the SAN may be an IP-SAN using a TCP/IP network and implemented depending on an SCSI over TCP/IP or Internet SCSI (iSCSI) protocol. In other embodiments, the network 1300 may be a general network such as a TCP/IP network. For example, the network 1300 may be implemented depending on a protocol such as FC over Ethernet (FCoE), Network Attached Storage (NAS), NVMe over Fabrics (NVMe-oF).

Hereinafter, descriptions will be mainly given with respect to the application server 3100 and the storage server 3200. The description of the application server 3100 may be applied to another application server 3100n, and the description of the storage server 3200 may be applied to another storage server 3200m.

The application server 3100 may store data, requested to be stored by a user or a client, in one of the storage servers 3200 to 3200m through the network 3300. The application server 3100 may obtain data, requested to be read by the user or the client, from one of the storage servers 3200 to 3200m through the network 3300. For example, the application server 3100 may be implemented as a web server, a database management system (DBMS), or the like.

The application server 3100 may access the memory 3120n or the storage device 3150n, included in another application server 3100n, through the network 3300 or may access the memories 3220 to 3220m or the storage devices 3250 to 3250m, include in the storage servers 3200 to 3200m, through the network 3300.

Accordingly, the application server 3100 may perform various operations on data stored in the application servers 3100 to 3100n and/or the storage servers 3200 to 3200m. For example, the application server 3100 may execute an instruction to move data between the application servers 3100 to 3100n and/or storage servers 3200 to 3200m or to copy the data. In this case, the data may be moved to the memories 3120 to 3120n of the application servers 3100 to 3100n from the storage devices 3250 to 3250m of the storage servers 3200 to 3200m through the memories 3220 to 3220m of the storage servers 3200 to 3200m, or may be directly moved to the memories 3120 to 3120n of the application servers 3100 to 3100n from the storage devices 3250 to 3250m of the storage servers 3200 to 3200m.

A description will be given with respect to the storage server 3200 as an example. The interface 3254 may provide a physical connection between the processor 3210 and the controller 3251 and a physical connection between a network interface controller 3240 and the controller 3251. For example, the interface 3254 may be implemented in a direct attached storage (DAS) manner in which the storage server 3200 and the storage device 3250 are directly connected using a dedicated cable. For example, the interface 3254 may be implemented in various interface protocols Advanced Technology Attachment (ATA), Serial ATA (SATA), external SATA (e-SATA), Small Computer Small Interface (SCSI), Serial Attached SCSI (SAS), Peripheral PCI Component Interconnection (PCI express), PCIe (NV express), NVMe (NVM express), IEEE 1394, universal serial bus (USB), secure digital (SD) card, multi-media card (MMC), embedded multi-media card (eMMC), Universal Flash Storage (UFS), Compact Flash (CF) card interface, and the like.

The storage server 3200 may further include a switch 3230 and a network interface controller 3240. The switch 3230 may selectively connect the processor 3210 and the storage device 3250 or may selectively connect the network interface controller 3240 and the storage device 3250, under the control of the processor 3210.

The network interface controller 3240 may connect the storage server 3200 to the network to perform communication, and may be referred to as a network interface card, a network adapter, or the like. The network interface controller 3240 may be connected to the network 3300 through a wired interface, a wireless interface, a Bluetooth interface, an optical interface, or the like. The network interface controller 3240 may include an internal memory, a digital signal processor (DSP), a host bus interface, and the like, and may be connected to a processor 3210 and/or a switch 3230 through a host bus interface. The host bus interface may be implemented as one of the above-described examples of the interface 3254. In an example embodiment, the network interface controller 3240 may be integrated with at least one of the processor 3210, the switch 3230, and the storage device 3250.

In the storage servers 3200 to 3200m or the application servers 3100 to 3100n, a processor may transmit a command to the storage device 3250 to 3250m and 3150 to 3150n or the memories 3220 to 3220m and 3120 to 3120n to program or read data. In this case, the data may be error-corrected data through an error correction code (ECC) engine. The data may be data bus inversion (DBI) or data masking (DM) processed data, and may include cyclic redundancy code (CRC) information.

The storage device 3250 to 3250m may transmit a control signal and a command/address signal to NAND flash memory device 3252 to 3252m in response to a reading command received from the processor. Accordingly, when data is read from the NAND flash memory device 3252 to 3252m, a read enable (RE) signal may be input as a data output control signal to serve to output data to a DQ bus. A data strobe DQS may be generated using the RE signal. The command and the address signal may be latched to a page buffer according to a rising edge or a falling edge of a write enable (WE) signal.

The controller 3251 may control the overall operation of the storage device 3250. In an example embodiment, the controller 3251 may include a static random access memory (SRAM). The controller 3251 may write data to the NAND flash memory device 3252 in response to a writing command, or may read data from the NAND flash memory device 3252 in response to a reading command. For example, the writing command and/or the reading command may be provided from a processor 3210 in the storage server 3200, a processor 3210m in another storage server 3200m, or processors 3110 and 3110n in the application servers 3100 and 3100n.

The NAND flash memory device 3252 may be a memory device according to various example embodiments described with reference to FIGS. 1 to 18. The NAND flash memory device 3252 may decrease a channel boosting level during a writing verify operation and/or a read operation to prevent soft erase from occurring and to secure reliability. In addition, the NAND flash memory device 3252 may selectively apply pre-pulse voltage to an unselected string select line or an unselected ground select line to reduce power consumption.

By way of summation and review, the use of a pre-pulse scheme may allow a pre-pulse voltage to be input to an unselected string select line and an unselected ground select line before a read voltage is input to a selected wordline. In a general pre-pulse scheme, a pre-pulse voltage may be input to both an unselected string select line and an unselected ground select line during a setup period, and thus, not only power consumption but also a size of a power supply may be increased.

As described above, in the memory device according to example embodiment, a potential level of a channel region may be controlled using at least one wordline, among a plurality of wordlines, as a barrier line. Thus, soft erase may be prevented from occurring in a read operation.

In addition, in the memory device according to example embodiments, a control signal input to at least one wordline adjacent to a barrier line during a channel boosting period may be limited to a predetermined level to prevent hot-carrier injection which may occur in the barrier line.

In addition, in the memory device according to example embodiments, a pre-pulse voltage may be selectively input to an unselected string select line and an unselected ground select line to significantly reduce power consumption and an increase in a size of a power supply.

Embodiments may provide a memory device, capable of preventing degradation of a threshold voltage distribution of a memory cell while significantly reducing increases in power consumption and a size of a power supply, and an operating method of the memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
a memory cell array including a plurality of cell strings each including a plurality of memory cells, respectively connected between a plurality of string select lines and a plurality of ground select lines, and a plurality of wordlines connected to the plurality of memory cells;
a control logic configured to generate a first voltage that is provided to the plurality of string select lines, and a second voltage that is provided to the plurality of ground select lines, and to adjust each voltage level of the first voltage and the second voltage to control a channel boosting level of the plurality of cell strings; and
a row decoder configured to provide a read voltage, a read pass voltage, the first voltage, and the second voltage to the memory cell array under control of the control logic, wherein:
the control logic generates one of the first voltage and the second voltage as a pre-pulse voltage, and
the row decoder provides a third voltage to at least one of the plurality of wordlines, the third voltage having a first level while the pre-pulse voltage has a level higher than or equal to a predetermined first threshold value, and having a second level higher than the first level while the pre-pulse voltage has a level lower than the first threshold value.

2. The memory device as claimed in claim 1, wherein:
the control logic selects at least one of the plurality of cell strings as a selected cell string, and the row decoder provides a predetermined turn-on voltage to a string select line and a ground select line, connected to the selected cell string, and provides the first voltage and the second voltage to a string select line and a ground select line, not connected to the selected cell string, respectively.

3. The memory device as claimed in claim 2, wherein the pre-pulse voltage has a level lower than a level of the turn-on voltage.

4. The memory device as claimed in claim 1, wherein the second level is lower than a level of the read pass voltage.

5. The memory device as claimed in claim 1, wherein each channel of the plurality of cell strings is separated into a first channel and a second channel, based on a wordline to which the third voltage is provided, during a period in which the pre-pulse voltage has a level higher than or equal to the first threshold value.

6. The memory device as claimed in claim 5, wherein:
the first channel has a first potential level and the second channel has a second potential level lower than the first potential level, when the first voltage is generated as the pre-pulse voltage, and each channel of the plurality of cell strings has a level obtained by summing the first potential level and the second potential level at a predetermined ratio during a period in which the pre-pulse voltage has a level lower than the first threshold value.

7. The memory device as claimed in claim 5, wherein the first channel and the second channel are merged into one channel, during the period in which the pre- pulse voltage has a level below the first threshold value.

8. The memory device as claimed in claim 1, wherein the control logic controls the row decoder to adjust a level of the read pass voltage and to provide the read pass voltage having the adjusted level to at least one wordline adjacent to a wordline, to which the third voltage is provided, among the plurality of wordlines.

9. The memory device as claimed in claim 8, wherein the control logic controls the row decoder to adjust the level of the read pass voltage to be greater as a wordline is adjacent to the wordline provided with the third voltage, and to provide the adjusted read pass voltage to the wordline.

10. The memory device as claimed in claim 1, wherein the wordline provided with the third voltage is selected as at least one dummy wordline connected to memory cells that do not store data, among the plurality of wordlines.

11. The memory device as claimed in claim 1, wherein the wordline provided with the third voltage is selected as at least one wordline disposed at a boundary between an upper channel structure and a lower channel structure passing through the plurality of wordlines.

12. The memory device as claimed in claim 1, wherein the read pass voltage is 10V or lower, and the first and the second voltages are 3V or higher to 4V or lower.

13. A memory device, comprising:
a plurality of cell strings, each including a plurality of memory cells disposed at intersections of a plurality of wordlines and a plurality of bitlines, and connected between a plurality of string select lines and a plurality of ground select lines in series; and
a control logic configured to select at least one of the plurality of cell strings to perform a read operation or a program verify operation, and to control a pre-pulse voltage such that the pre- pulse voltage is selectively input to a string select line or a ground select line, connected to an unselected cell string, wherein:
the pre-pulse voltage has a value that is greater than a predetermined threshold value during a period before a predetermined read voltage according to a threshold voltage distribution is input to a selected cell string, and has a value that is less than or equal to the predetermined threshold value during a period in which the predetermined read voltage is input,
the control logic selects at least one of the plurality of wordlines as a barrier line, for dividing a channel of the unselected cell string into a plurality of channels in a period before the predetermined read voltage is input, and
the barrier line partially boosts a potential of the divided plurality of channels by preventing potential sharing between the divided plurality of channels.

14. The memory device as claimed in claim 13, wherein the control logic changes a position of the barrier line according to a position of a wordline to which the predetermined read voltage is input in the selected cell string.

15. The memory device as claimed in claim 13, wherein the plurality of string select lines are respectively connected to gate terminals of a plurality of string select transistors.

16. A memory device, comprising:
a memory cell array including a plurality of cell strings, each including a plurality of memory cells, and a plurality of wordlines connected to the plurality of memory cells;

a control logic configured such that a plurality of string select lines or a plurality of ground select lines, connected to the plurality of cell strings, are controlled to be pre-charged, and a voltage applied to at least one of the plurality of wordlines is adjusted to control a potential level of each channel of the plurality of cell strings, to perform a read operation and a program verify operation; and a row decoder configured to input a read voltage or a read pass voltage to the plurality of wordlines to control the read operation or the program verify operation under control of the control logic, wherein the control logic selects at least one wordline, among wordlines connected to dummy memory cells among the plurality of memory cells, as a barrier line, and inputs a predetermined control voltage having a level that is lower than a level of the read pass voltage to control a potential level of the channel.

17. The memory device as claimed in claim 16, wherein the memory device has a structure in which a cell region including the memory cell array and a peripheral circuit region including the control logic and the row decoder are stacked in a direction perpendicular to a substrate.

18. The memory device as claimed in claim 16, wherein the control logic selects two or more wordlines disposed apart from each other among the plurality of wordlines, as the barrier line.

19. The memory device as claimed in claim 16, wherein the control logic selects at least one wordline disposed at a boundary between an upper channel structure and a lower channel structure passing through the plurality of wordlines, as the barrier line.

* * * * *